US 9,572,288 B2

(12) United States Patent
Wilcox et al.

(10) Patent No.: US 9,572,288 B2
(45) Date of Patent: Feb. 14, 2017

(54) SYSTEM AND METHOD FOR MODULAR DATA CENTER

(71) Applicant: Liebert Corporation, Columbus, OH (US)

(72) Inventors: Eric Wilcox, Cedar Park, TX (US); John Hoeffner, St. Louis, MO (US); Stjepan Sinkovic, Zagreb (HR); Denis Rancic, Samobor (HR); Zeljko Gjuranic, Zagreb (HR)

(73) Assignee: Liebert Corporation, Columbus, OH (US)

( * ) Notice: Subject to any disclaimer, the term of this patent is extended or adjusted under 35 U.S.C. 154(b) by 0 days.

(21) Appl. No.: 14/504,081

(22) Filed: Oct. 1, 2014

(65) Prior Publication Data
US 2015/0098177 A1     Apr. 9, 2015

Related U.S. Application Data

(60) Provisional application No. 61/886,402, filed on Oct. 3, 2013.

(51) Int. Cl.
H05K 7/20     (2006.01)
H05K 7/14     (2006.01)
(Continued)

(52) U.S. Cl.
CPC ............ H05K 7/20736 (2013.01); E04H 5/02 (2013.01); H05K 7/1492 (2013.01);
(Continued)

(58) Field of Classification Search
CPC ............ H05K 7/20736; H05K 7/20745; H05K 7/1492; H05K 7/1497
(Continued)

(56) References Cited

U.S. PATENT DOCUMENTS 7,269,753 B2     9/2007  Farkas et al.
7,278,273 B1 *  10/2007  Whitted ............... H05K 7/1497
                                                361/690
(Continued)

FOREIGN PATENT DOCUMENTS

GB           2467808 A      8/2010
WO       2011038348 A1      3/2011
(Continued)

OTHER PUBLICATIONS

International Search Report and Written Opinion of the International Searching Authority for PCT/US2014/058771 mailed Feb. 2, 2015.
(Continued)

Primary Examiner — Tuan T Dinh
Assistant Examiner — Mukund G Patel
(74) Attorney, Agent, or Firm — Harness, Dickey & Pierce, P.L.C.

(57)   ABSTRACT

A modular data center is disclosed. The modular data center may have a plurality of unit structures arranged generally parallel to one another. A plurality of supports may be used for supporting the unit structures elevationally above a floor, and wherein adjacent ones of the unit structures form hot aisles therebetween through which hot air generated from data center components may be channeled. Each unit structure may form an elongated structure having a frame structure, a roof panel supported by the frame structure, and a ceiling panel. The unit structures may be used to channel cold air to the data center components and hot air from the hot aisles out from the unit structures.

18 Claims, 24 Drawing Sheets

(51) Int. Cl.
*E04H 5/02* (2006.01)
*E04H 5/00* (2006.01)

(52) U.S. Cl.
CPC ....... *H05K 7/1497* (2013.01); *H05K 7/20745* (2013.01); *E04H 2005/005* (2013.01); *Y10T 29/49* (2015.01)

(58) Field of Classification Search
USPC ..................................... 361/679.31; 454/184
See application file for complete search history.

(56) References Cited

U.S. PATENT DOCUMENTS

| | | | |
|---|---|---|---|
| 7,395,444 | B2 | 7/2008 | Ives |
| 7,500,120 | B2 | 3/2009 | Egan et al. |
| 7,917,792 | B2 | 3/2011 | Brech et al. |
| 8,320,125 | B1 | 11/2012 | Hamburgen et al. |
| 2008/0135691 | A1* | 6/2008 | Buck .......................... F16L 3/24 248/62 |
| 2008/0277391 | A1 | 11/2008 | Ciccaglione |
| 2009/0287943 | A1 | 11/2009 | Brey et al. |
| 2009/0287949 | A1 | 11/2009 | Bradicich et al. |
| 2011/0108207 | A1* | 5/2011 | Mainers ............ H05K 7/20745 160/87 |
| 2011/0307102 | A1* | 12/2011 | Czamara ............... H05K 7/1497 700/277 |
| 2012/0300391 | A1* | 11/2012 | Keisling ............ H05K 7/20745 361/679.46 |

FOREIGN PATENT DOCUMENTS

| | | |
|---|---|---|
| WO | 2012118554 A1 | 9/2012 |
| WO | 2014/039524 A2 | 3/2014 |

OTHER PUBLICATIONS

International Search Report and Written Opinion of the International Searching Authority for PCT/US2016/036683 mailed Sep. 22, 2016.

* cited by examiner

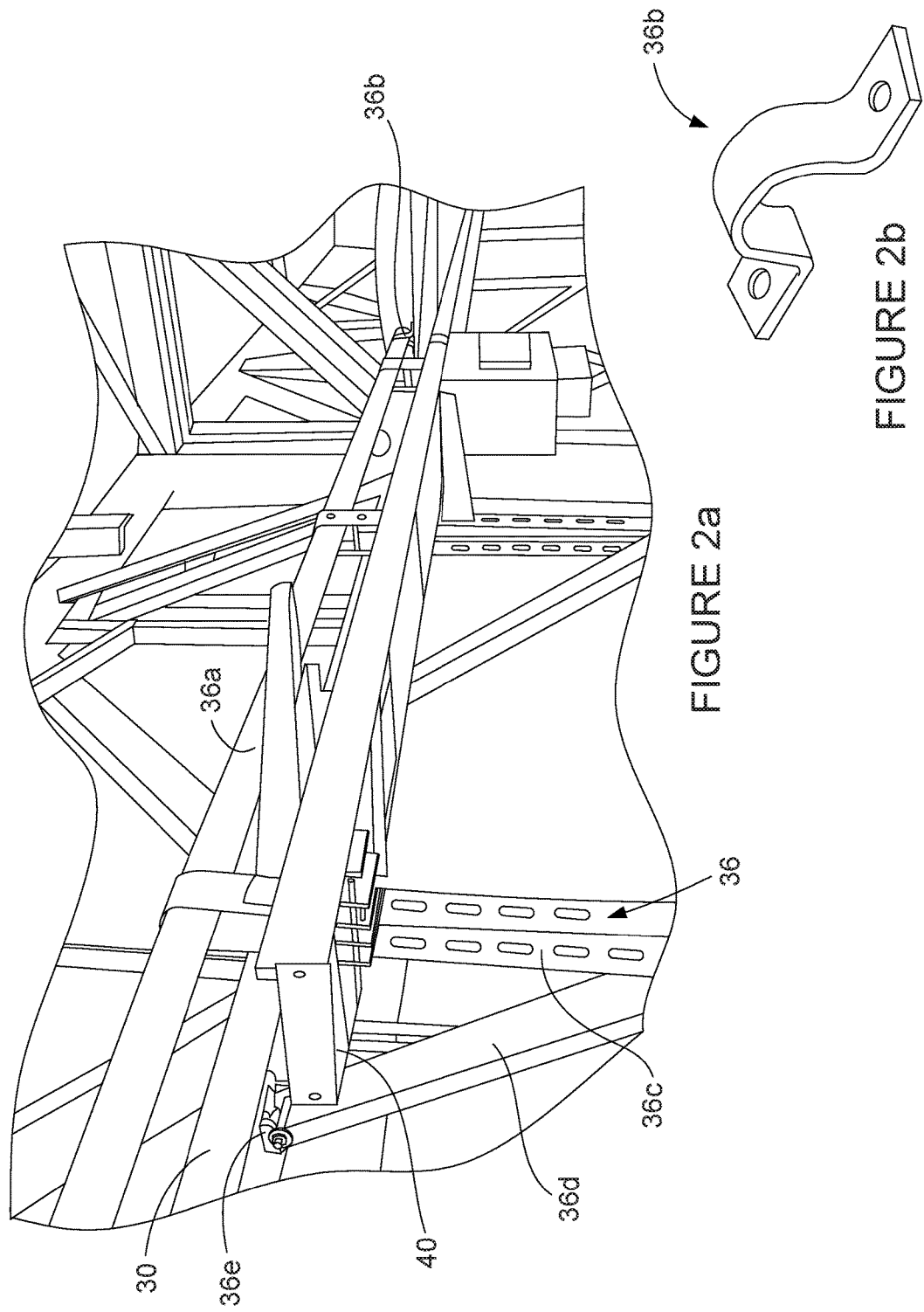

SYSTEM AND METHOD FOR MODULAR DATA CENTER

CROSS-REFERENCE TO RELATED APPLICATIONS

This application claims the benefit of U.S. Provisional Application No. 61/886,402, filed on Oct. 3, 2013. The entire disclosure of the above application is incorporated herein by reference.

FIELD

The present disclosure relates to data center systems and methods for constructing data centers, and more particularly to a modular, pre-fabricated data center structure that is able to be configured in a highly space efficient manner for shipping purposes and then easily deployed at a destination site to form a data center, and further which is readily modularly expandable to meet changing data center needs at the destination site.

BACKGROUND

The statements in this section merely provide background information related to the present disclosure and may not constitute prior art.

As data center needs increase world-wide, there has been increasing interest in finding more cost effective ways to set up and construct data centers. Additional concerns are consistent quality of the data center components and the time required to construct the data center. These concerns are especially relevant when constructing data centers in countries other than the United States. Traditionally data centers have been constructed in "stick building" fashion completely at the selected data center site. This involves bringing all the raw materials out to the data center site, using large numbers of construction workers such as electrical contractors, welders, building construction workers and other skilled tradesmen to construct the data center structure from the raw materials shipped to the site. As will be appreciated, this construction approach can be quite costly. Maintaining quality of the finished data center structure can sometimes be challenging, typically requiring numerous inspections by various individuals as the construction process is on-going. Construction delays may be encountered when specific subcomponents or raw materials being used to construct the data center are not received at the building site according to the planned construction timetable. The need to separately ship independent building components (steel, cable trays, wall panels, etc.) to the site can also contribute significantly to the overall high cost of constructing a data center. Seasonal weather changes and delays brought on by inclement weather can also result in a lengthy and costly construction timeline for a data center structure.

Additional concerns with data centers are the ability to easily and cost-effectively expand the data center as needs grow. With conventional data center structures that have been constructed using the "stick build" approach, expansion can sometimes be expensive and particularly time consuming.

Accordingly, there is strong interest in reducing the cost of a data center structure as well as the time needed for its construction. Significantly reducing the overall construction cost of a data center structure and the time required to get a new data center up and running may make it feasible to set up data centers in various parts of the world where the cost of constructing a data center with the conventional "stick build" approach would make the endeavor cost prohibitive.

SUMMARY

In one aspect the present disclosure relates to a modular data center. The modular data center may comprise a plurality of unit structures arranged generally parallel to one another. A plurality of supports may be used for supporting the unit structures elevationally above a floor, and wherein adjacent ones of the unit structures form hot aisles therebetween through which hot air generated from data center components may be channeled. Each unit structure may form an elongated structure having a frame structure, a roof panel supported by the frame structure, and a ceiling panel. The ceiling panel may be spaced apart from the roof panel to define a volume through which the hot air from one of the hot aisles may be received and channeled. The roof panel helps to form a cold aisle between adjacent rows of data center components disposed below the unit structure. The cold aisle may be configured for channeling cold air between the data center components.

In another aspect the present disclosure relates to a method for forming a modular data center. The method may include providing a plurality of unit structures each having a frame, with each unit structure operating to help form a cold aisle through which cold air may be circulated, as well as a hot aisle through which hot air maybe circulated. The unit structures may be supported above a floor to allow data center components to be positioned under each of the unit structures in two rows facing each other to help form the cold aisle. One row of each of the two rows of data center components from adjacent ones of the unit structures may be used to help form the hot aisle therebetween. The method may further include configuring each of the unit structures to form a volume, defined at least in part by a ceiling panel and at least in part by a roof panel, through which the hot air from one of the hot aisles may be received and channeled. The method may further include using the roof panel to help form the cold aisle between adjacent rows of data center components disposed below the unit structure, with the cold aisle being configured for channeling cold air between the data center components.

In still another aspect the present disclosure relates to a modular unit structure configured to help form a modular data center. The modular unit structure may include a frame forming an elongated structure, at least one roof panel supported by the frame, a plurality of supports for supporting the frame above a floor, and at least one ceiling panel supported by the frame in spaced apart relation to the roof panel to form a volume between the ceiling panel and the roof panel. The volume may operate as a channel for channeling hot air originating from data center components positioned below the unit structure, where the data center components are positioned in two rows facing one another. The unit structure may further operate to help form a cold aisle between the two rows of data center components, through which cold air is circulated; and wherein additional ones of the unit structures may be disposed adjacent one another in a plurality of rows to form a modularly expandable data center.

BRIEF DESCRIPTION OF THE DRAWINGS

The drawings described herein are for illustration purposes only and are not intended to limit the scope of the present disclosure in any way. In the drawings:

FIG. 2a is a perspective view of a portion of one form of pivoting mechanism that may be used to support the hangers, which involves the use of an elongated tubular support member which is able to rotate;

FIG. 2b is an enlarged perspective view of the saddle-like strap shown in FIG. 2a which may be used to help enable rotational movement of the elongated tubular support member shown in FIG. 2a;

FIG. 6a is a perspective view of a portion of one end of the data center illustrating how hot air from a hot air isle may be exhausted through the modular penthouse exhaust structure;

DETAILED DESCRIPTION

Figure 1:
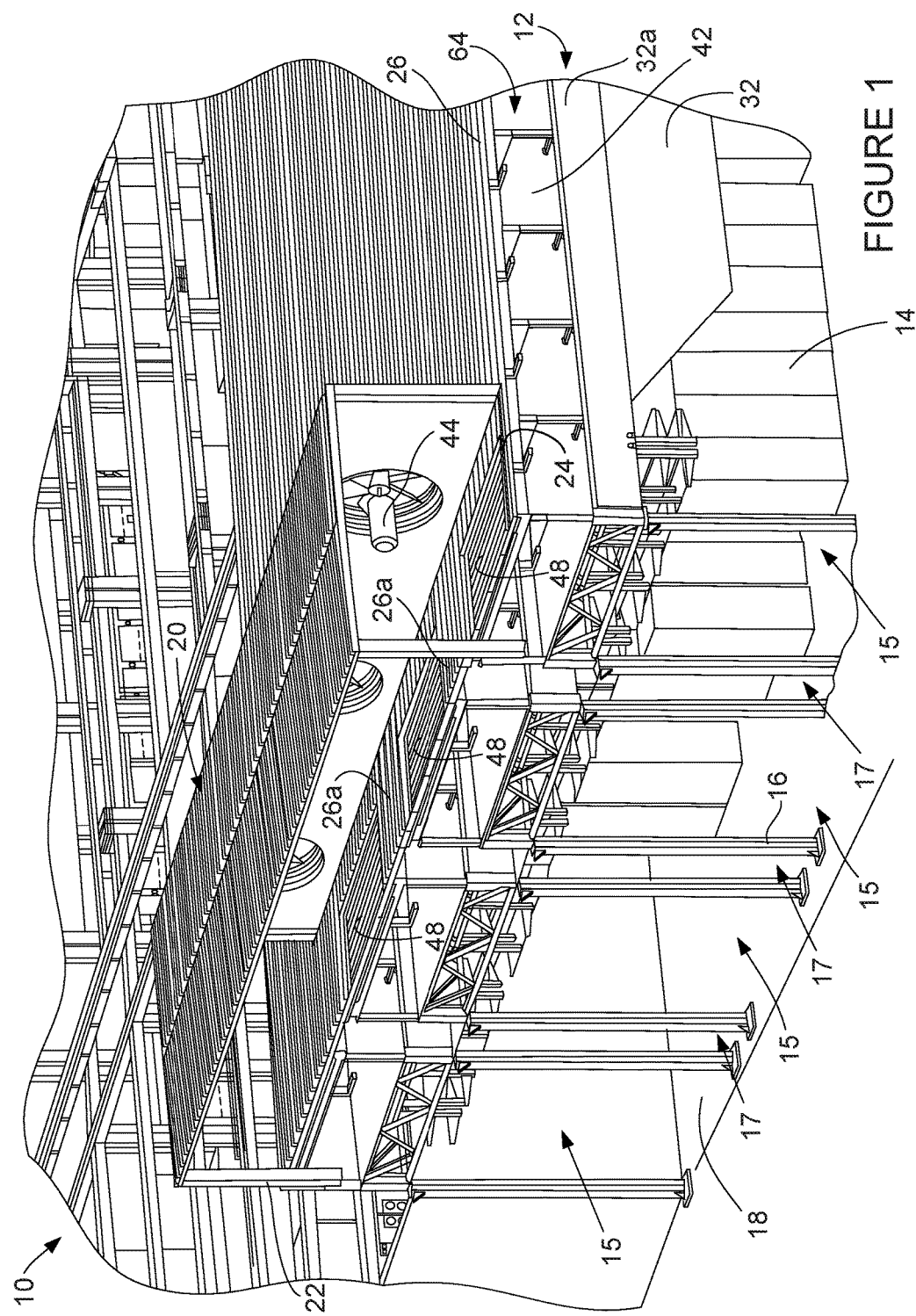
FIG. 1 is a perspective illustration of a plurality of modular, collapsible data center unit structures disposed adjacent one another to help form a data center, in accordance with one embodiment of the present disclosure.

The following description is merely exemplary in nature and is not intended to limit the present disclosure, application, or uses. It should be understood that throughout the drawings, corresponding reference numerals indicate like or corresponding parts and features.

Referring to FIG. 1 there is shown a portion of a modular data center facility 10 incorporating a plurality of modular, collapsible data center unit structures 12 (hereinafter simply "unit structures 12") for forming a rapidly deployable data center. Each of the unit structures 12 forms an elongated structure which may be used to channel both cold air from one or more air conditioning systems through a cold aisle 15 which separates parallel rows of equipment racks 14, as well to help channel hot air from a hot aisle. Each unit structure 12 is adapted to be supported by structural support columns 16 at a predetermined height above a floor 18 of the data center facility 10. FIG. 1 illustrates a plurality of the unit structures 12 positioned in side-by-side fashion. Adjacent ones of the unit structures 12 are further spaced apart a predetermined distance. This spacing forms hot aisles 17 between adjacent ones of the unit structures 12.

With further reference to FIG. 1, the modular data center facility 10 may also include one or more modular penthouse exhaust structures 20 for receiving hot air from the hot aisles 17 and exhausting the hot air from the modular data center facility 10. The modular penthouse exhaust structures 20 receive the hot air flow from the hot aisles 17 through openings 24 in ceiling panels 26 of the unit structures 12. This feature will be explained in greater detail in the following paragraphs. A plurality of bridging ceiling panels 26a are also used to bridge the spacing between adjacent ones of the unit structures 12, and thus ensure that hot air being drawn out from the hot aisles 17 is exhausted through the openings 24.

Figure 2:
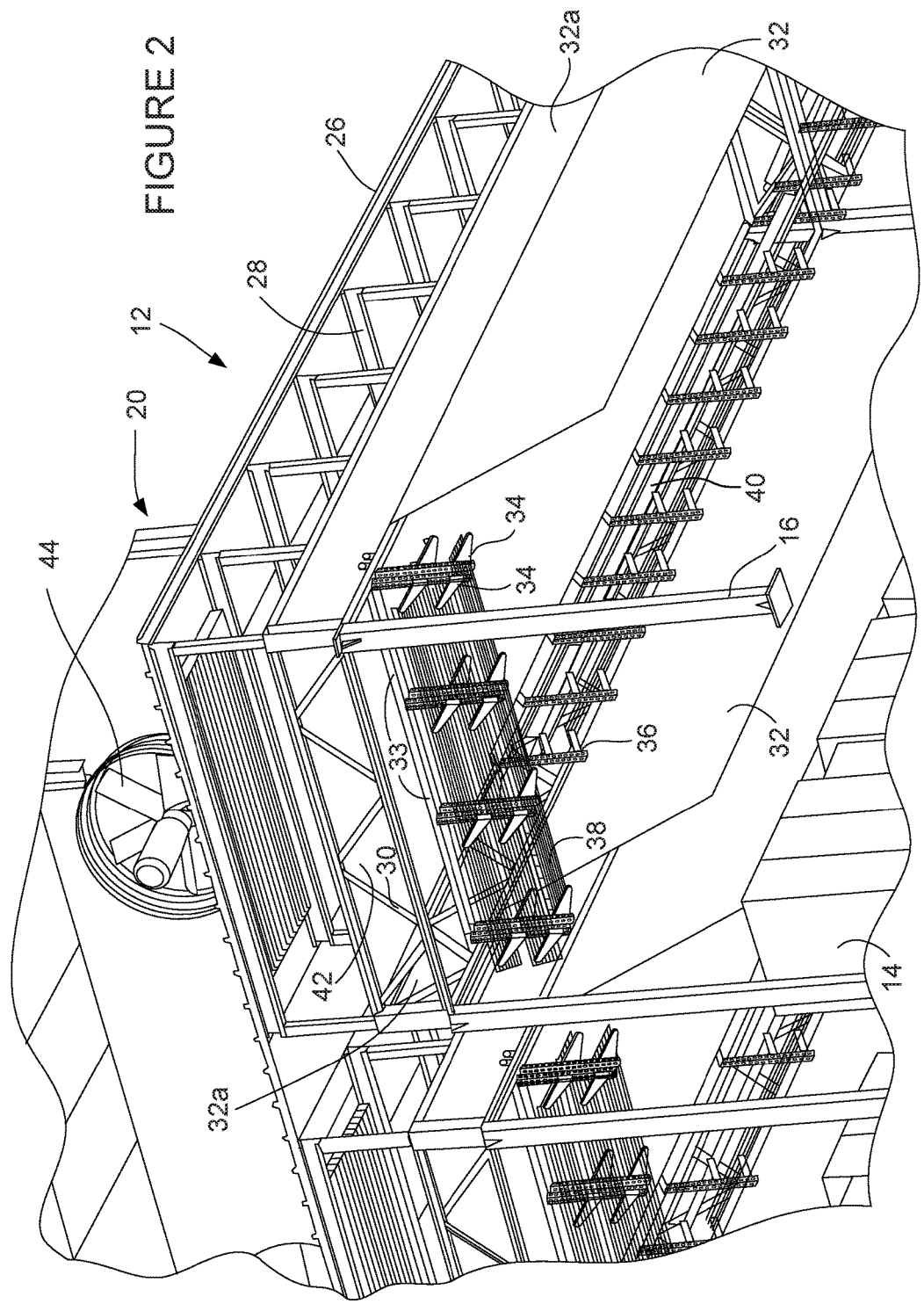
FIG. 2 is an enlarged perspective view of a portion of one of the data center unit structures of the present disclosure even more fully illustrating a plurality of foldable cable tray supports, along with one cable tray, that each unit structure incorporates.

Referring to FIG. 2, one of the unit structures 12 is shown in greater detail. In addition to the ceiling panel 26, each unit structure 12 has a frame structure 28 that supports a plurality of the ceiling panels 26 to form a roof-like structure. A perimeter frame structure 30 may be coupled to the structural support columns 16. The perimeter frame structure 30 may be used to support collapsible (i.e., foldable) panels 32 to help maintain cold air from air conditioning systems within the cold aisles 15 between adjacent rows of equipment racks 14. The perimeter frame structure 30 also may include a plurality of pivotally secured hangers 34 and 36 that are supported from the frame structure 30. Hangers 34 in this example are supported from separate cross members 33 and are able to pivot into the orientation shown in FIG. 2 for use. Hangers 34 may have a plurality of cable trays 38 secured thereto and hangers 36 may likewise have a plurality of cable trays 40 secured thereto. Cable trays 38 and 40 may be used to support a variety of different types of cables such as network cables, power cables, etc., that need to be routed through the data center facility 10 to equipment components mounted in the rows of equipment racks 14. A roof panel 42 may also be secured to the perimeter frame structure 30. Roof panel 42 forms a partition which further helps to channel cold air from one or more air conditioning systems through the cold aisle 15 formed between adjacent rows of equipment racks 14.

With brief reference to FIG. 2a, a portion of one of the hangers 36 is shown. The hanger 36 may be representative of, or identical, to the construction used for the hangers 34. The ability of the hanger 36 to pivot is achieved, in one example, by using a round, rigid, tubular, elongated support member 36a, which may be supported for rotational movement at its opposing ends by a saddle-like bracket 36b, where the saddle-like bracket 36b is fixedly secured to a portion of the perimeter frame structure 30 by suitable fasteners (not shown). The saddle like bracket 36b is also shown in FIG. 2b. Of course any other suitable hinge or hinge-like structures could be implemented to enable pivoting motion of the hanger 36.

FIG. 2a also shows that the hanger 36 may include a plurality of depending structural members 36c which may support the cable trays 40. The depending structural members 36c may be fixedly secured to the elongated support member 36a so as to be able to rotate with the elongated support member 36a, and thus be able to present the trays 40 in an operative position below the perimeter frame structure 30 or in a stowed orientation. One or more braces 36d may be used to brace the hanger 36 in its operative position. The braces 36d may each be secured at one end to the perimeter frame structure 30 by suitable brackets 36e that enable pivoting motion thereof, and at their opposite ends to the depending structural members 36c. This enables the braces 36d to be pivoted upwardly into stowed configurations once detached from the structural members 36c. Still, the braces 36d are able to be quickly and easily secured to the structural members 36c of the hanger 36, to brace the hanger 36 once the hanger 36 is lowered into its operative position. It will also be appreciated that the hangers 36, as well as the hangers 34, may be constructed from suitable structural supports and brackets to permit their easy removal from the perimeter frame structure 30, instead of a folding motion. Depending on how many cable trays 38 and 40 are employed, and the overall dimensions of the unit structure 12, it may be helpful or necessary to have the hangers 34 and or 36 supported by structure that is removable completely from the perimeter frame structure 30 when the unit structure is prepared for shipping.

Figure 5:
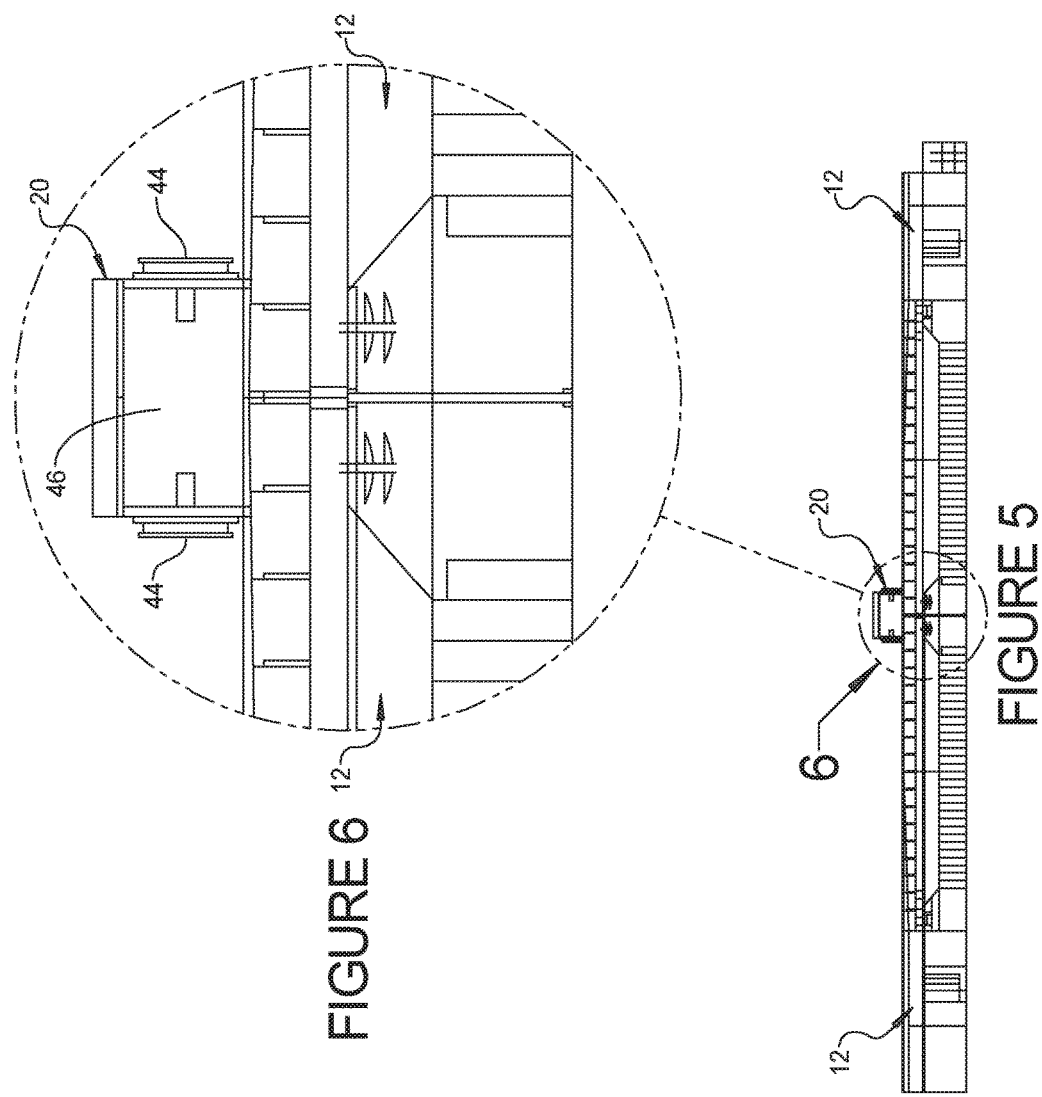
FIG. 5 is a high level side view of a portion of a data center in which two of the data center unit structures are shown forming an elongated row, and further illustrating a modular penthouse exhaust structure that resides above the data center unit structures to facilitate the exhaust of hot air from hot air isles formed between rows of equipment racks positioned underneath the unit structures.
Figure 6:
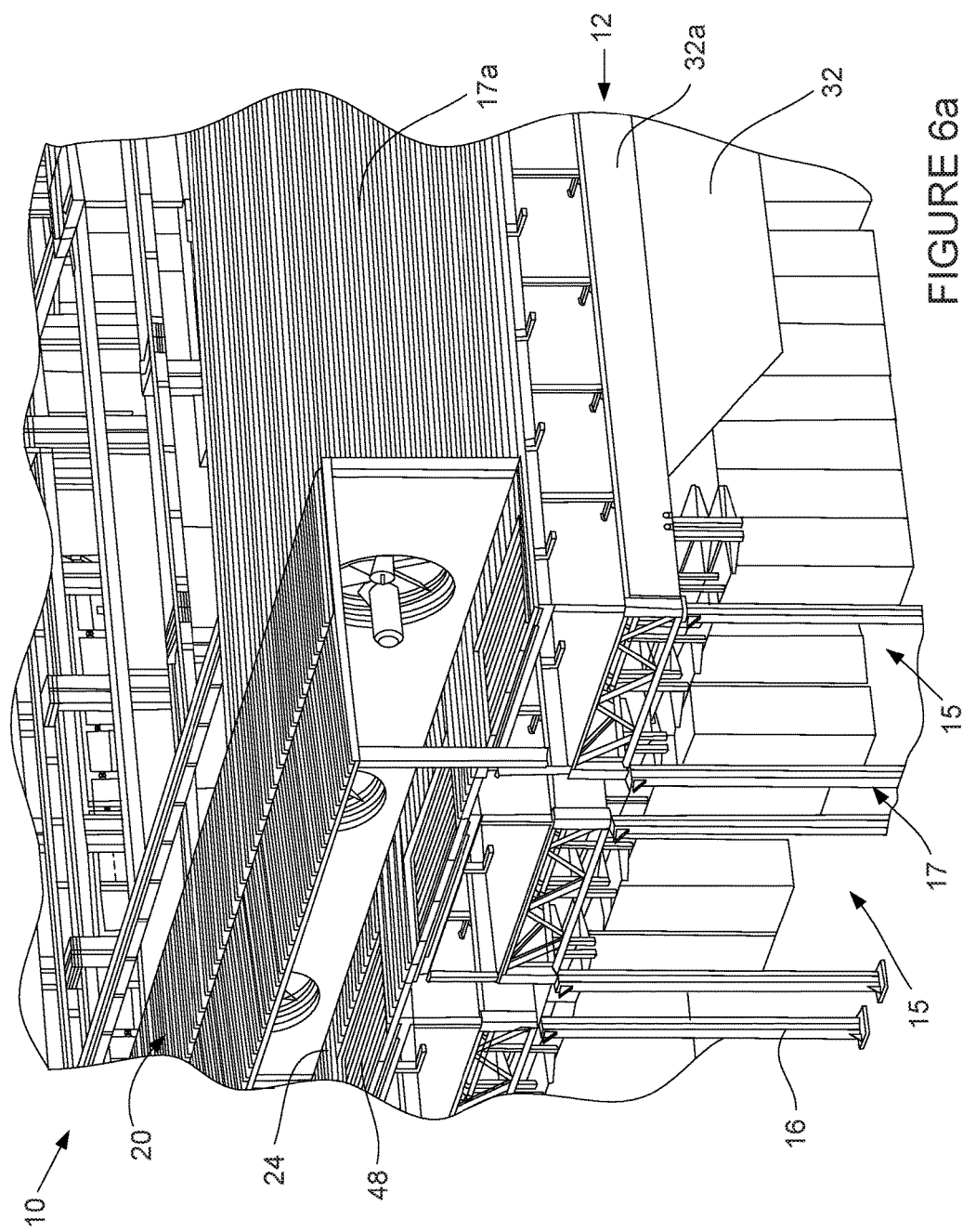
FIG. 6 is an enlarged view of just circled portion 6 in FIG. 5.

With reference to FIGS. 5, 6 and 6a, one of the modular penthouse exhaust structures 20 is shown from one end thereof. It will be appreciated that, in practice, a plurality of the modular penthouse exhaust structures 20 will be used to form an elongated channel 46 into which hot air 17a from the hot aisles 17 may be drawn into with the assistance of a plurality of opposing exhaust fans 44. In one embodiment each modular penthouse exhaust structure 20 may include a total of six exhaust fans 44 arranged as two opposing rows of three fans. With further reference to FIG. 1, the openings 24 in the ceiling panels 26 may also have positioned therein modulated louver assemblies 48 that may be electronically modulated to tailor the flow of hot air from the hot aisles 17 that may be drawn into the penthouse exhaust structures 20. Suitable air flow and/or temperature control monitoring systems (not shown) may be provided for this purpose.

Figure 3:
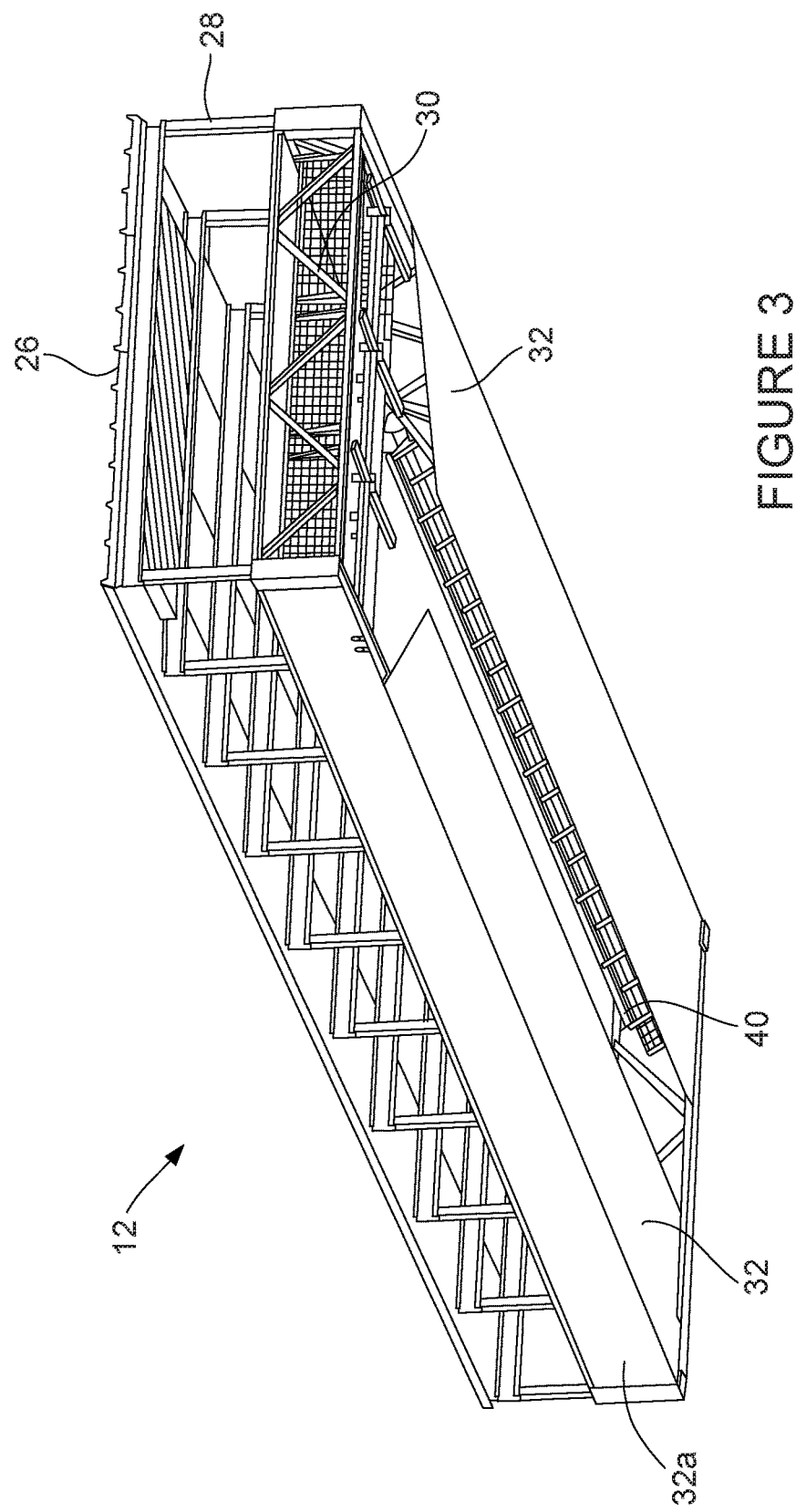
FIG. 3 is a perspective view of one of the data center unit structures shown in FIG. 1 but with the unit structure in its collapsed configuration for shipping.
Figure 4:
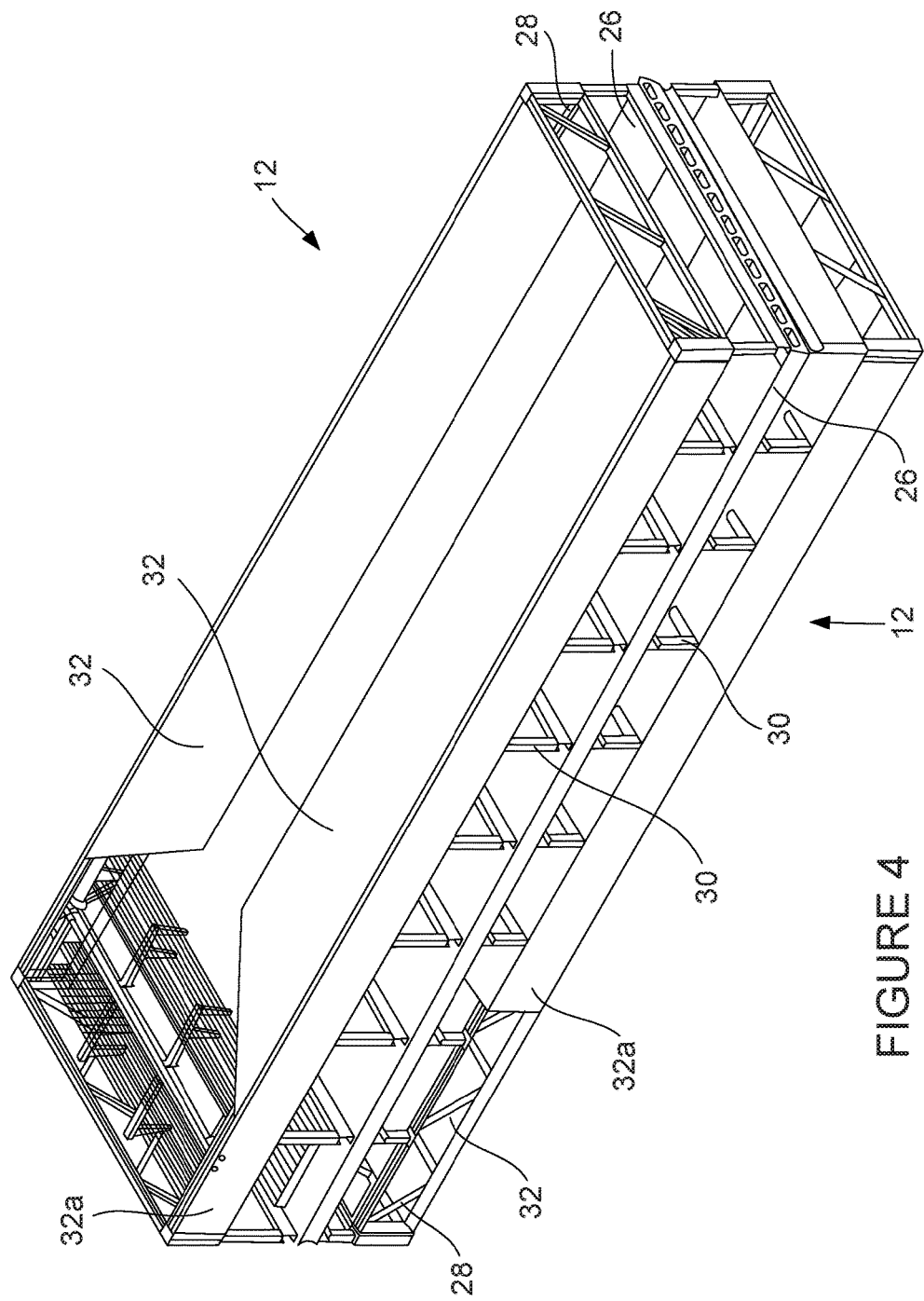
FIG. 4 is a perspective view of two data center unit structures in their collapsed configurations and positioned back-to-back, which forms a highly compact package suitable for placement in a standard shipping container.

Referring to FIG. 3, one of the unit structures 12 is shown in its collapsed configuration. The unit structure 12 has the hangers 34 and 36 pivoted into a stowed position where they are held such that they do not protrude below panel portions 32a of panels 32. Panels 32 are also pivoted such that they extend parallel to the ceiling panels 26. In the collapsed configuration the unit structure 12 forms an elongated, relatively narrow configuration with the hangers 34 and 36, as well as the cable trays 38 and 40, tucked up between the panel portions 32a. This configuration also forms a highly space efficient configuration from a shipping and packaging standpoint. Any suitable locking structure may be used in connection with the panels 32 to hold the panels 32 in their collapsed configuration, such as elongated structural beams (not shown) that may be physically connected to select portions of the panels 32 and the perimeter frame structure 30. FIG. 4 illustrates a pair of the unit structures 12 in their collapsed configurations positioned back-to-back. Each of the unit structures 12, when in its collapsed configuration, may have dimensions of approximately 12192 mm (40.0 feet) in overall length by 3658 mm (12.0 feet) in width and 2848 mm (5 feet and 5.22 inches) in height. The back-to-back positioned pair of unit structures 12 in FIG. 4 may have overall dimensions of about 12192 mm (40 feet) in length, 3658 mm (12 feet) in width and 2848 mm (9 feet and 4.13 inches) in overall height. The collapsed configuration enables a pair of the unit structures 12 to be efficiently packaged for shipping.

Figure 7:
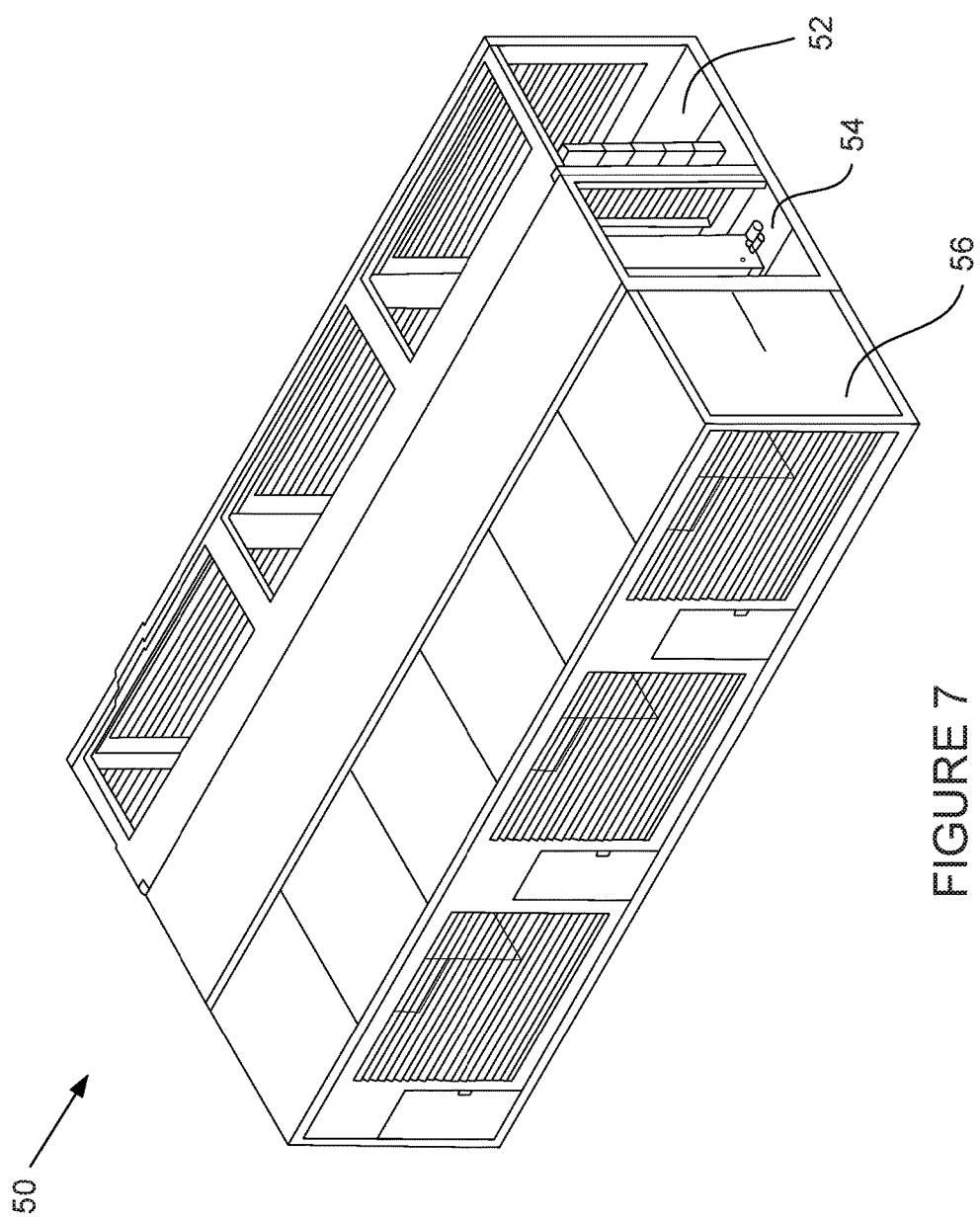
FIG. 7 is a perspective view of modular cooling unit that may be used with the data center unit structures to help form a modular data center.

FIG. 7 illustrates a modular cooling unit 50 that may be used to help form the modular data center facility 10 of FIG. 1. It will be noted that the modular cooling 50 may have dimensions of about 13761 mm (45 feet) in length, about 7315 mm (24 feet) in width and about 3500 mm (11 feet and 5.8 inches) in overall height. As such, the cooling module unit 50 is very similar in overall dimensions to the back-to-back pair of unit structures 12 shown in FIG. 4, which again facilitates shipping in a standardized shipping container.

Figure 8:
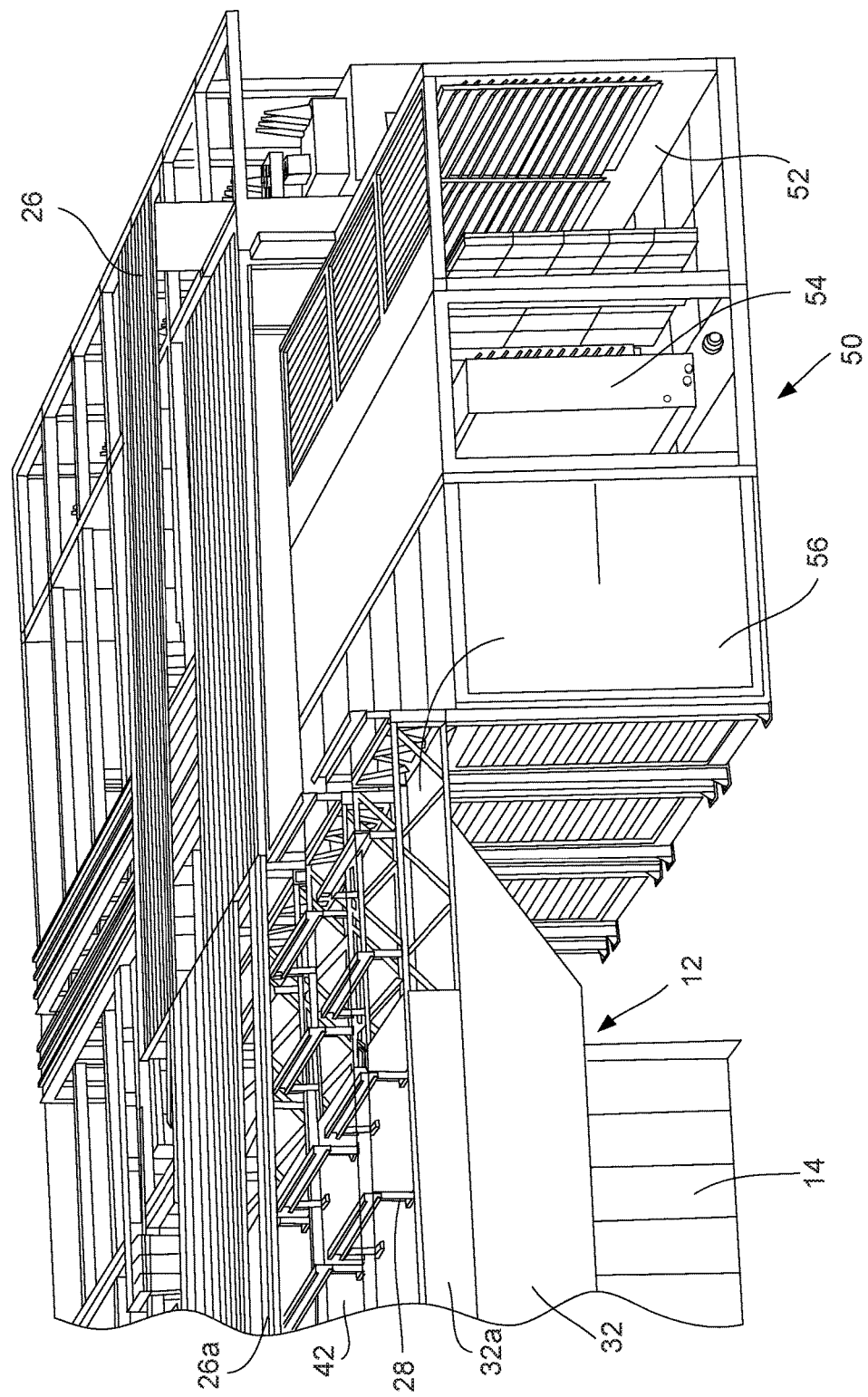
FIG. 8 shows a perspective view of one of the modular cooling units arranged adjacent the ends of a plurality of the data center unit structures.

In FIG. 8 one modular cooling unit 50 can be seen arranged so that its major length extends perpendicular to the major length of the unit structures 12, and such that it is positioned adjacent one of the ends of the unit structures 12. This enables the modular cooling unit 50 to supply cold air to the cold aisles 15 formed by a plurality of the unit structures 12.

Figure 9:
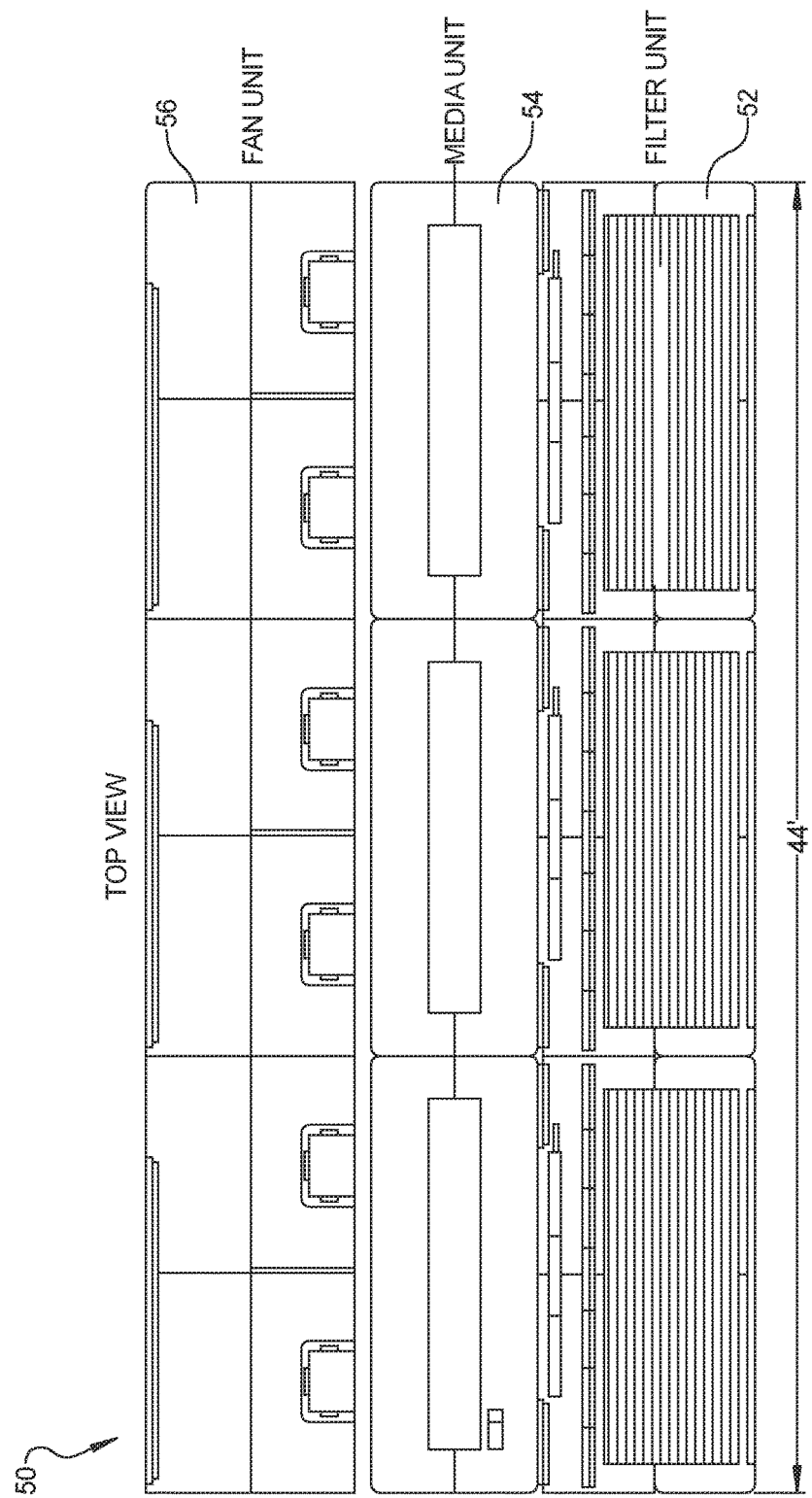
FIG. 9 is a high level top view illustrating the components of the modular cooling unit shown in FIG. 7.
Figure 10:
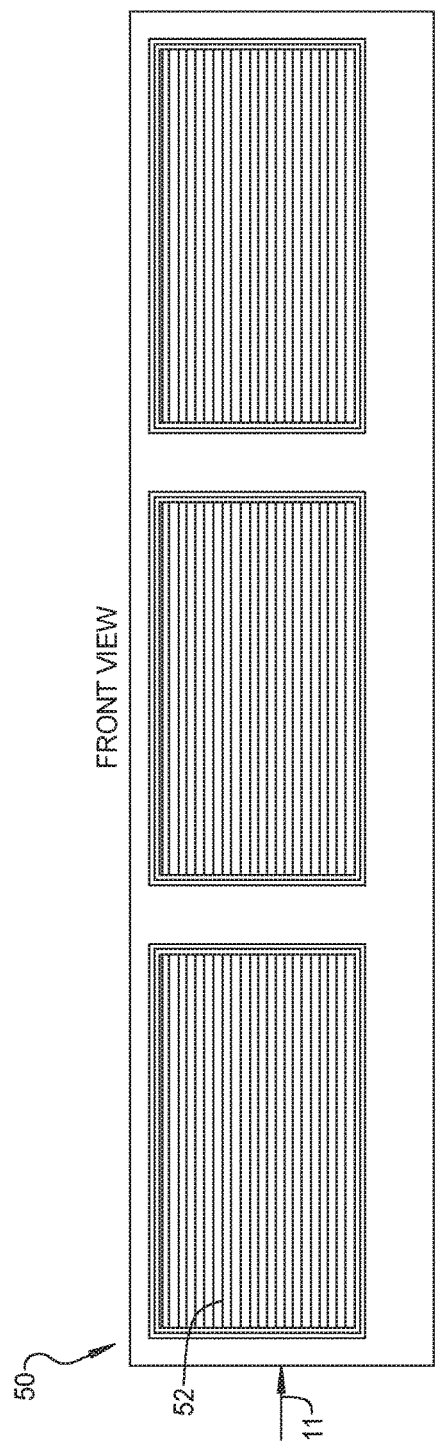
FIG. 10 is a high level front view of the modular cooling unit of FIG. 9.
Figure 11:
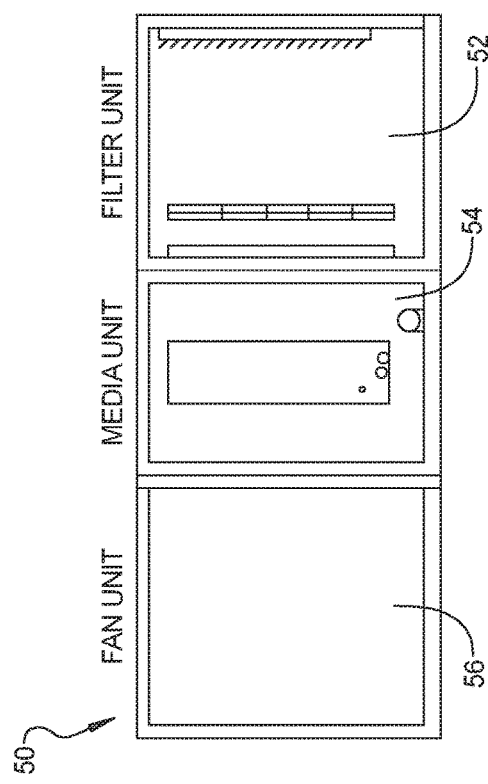
FIG. 11 is a high level side view of the cooling unit of FIG. 9 in accordance with arrow 11 in FIG. 10.
Figure 12:
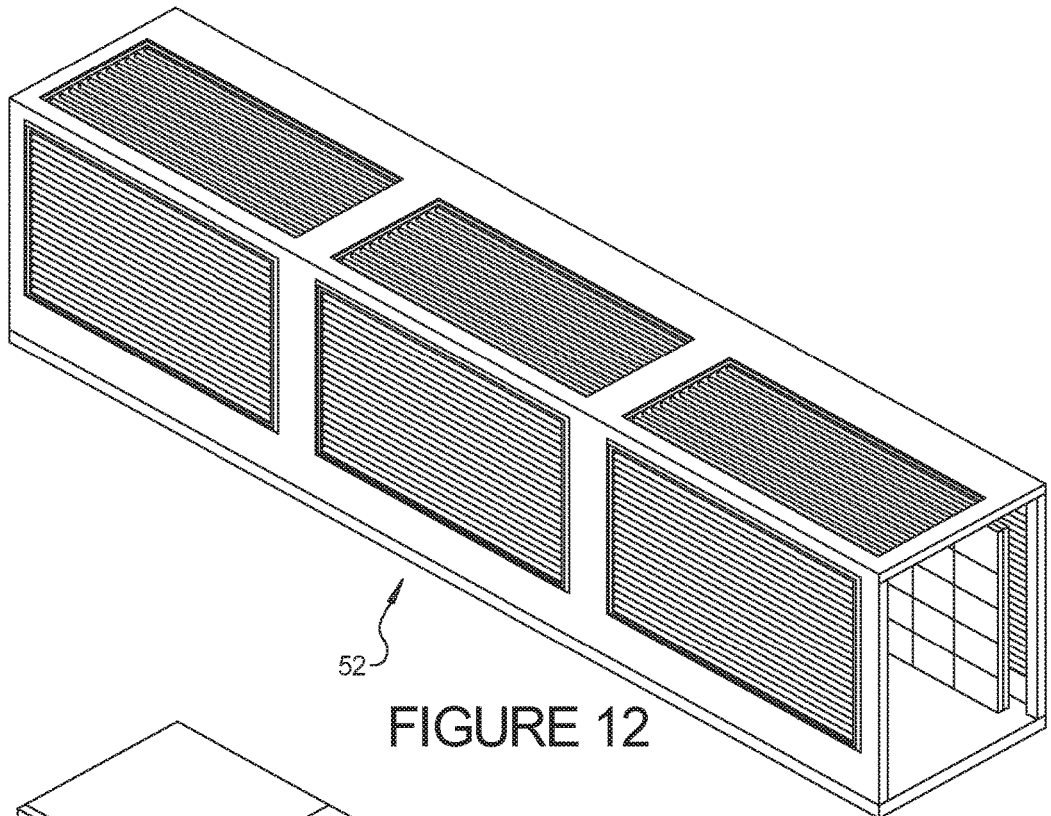
FIG. 12 is a high level perspective view of just a filter unit of the modular cooling unit.
Figure 13:
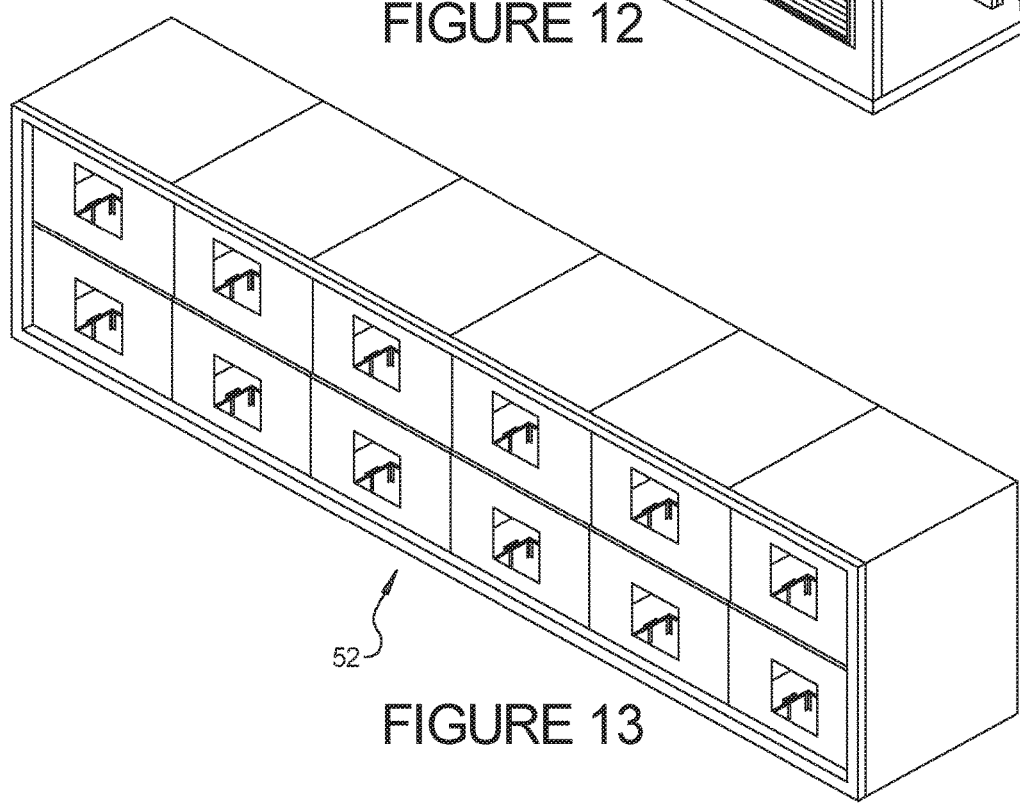
FIG. 13 is a high level perspective view of just a fan unit of the modular cooling unit.
Figure 14:
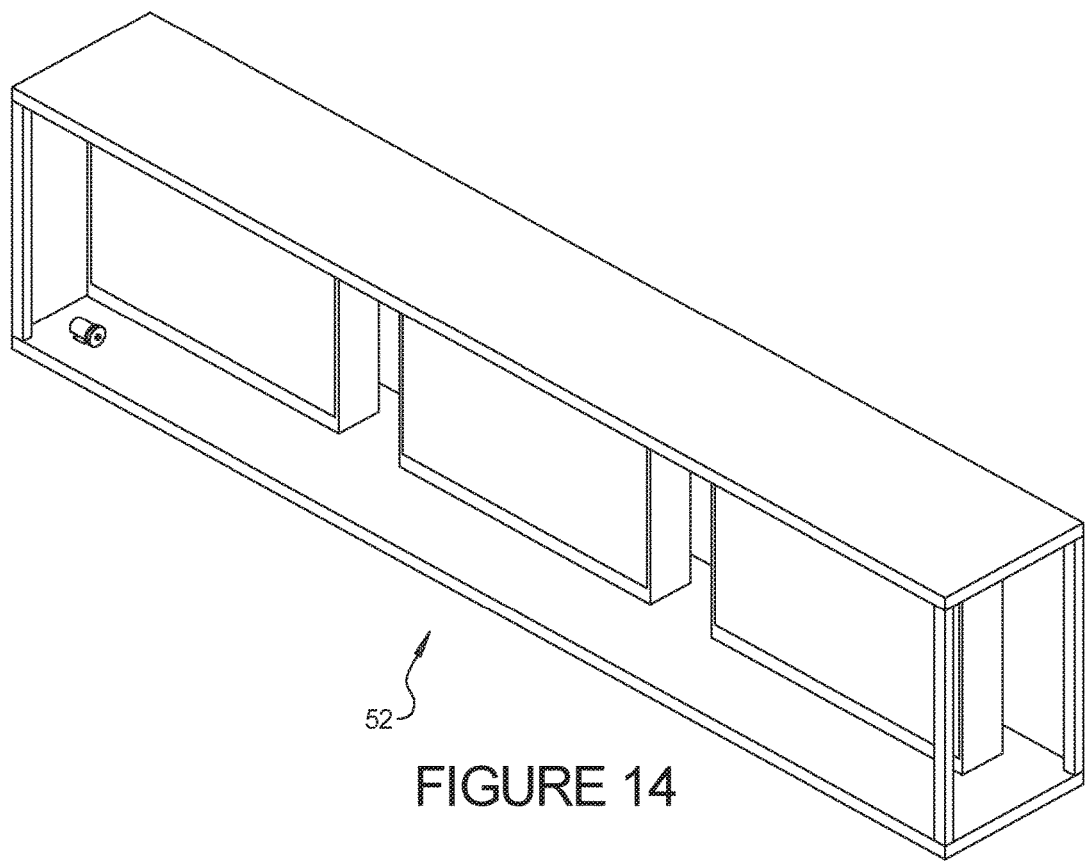
FIG. 14 is a high level perspective view of just a cooling module media unit of the modular cooling unit.
Figure 15:
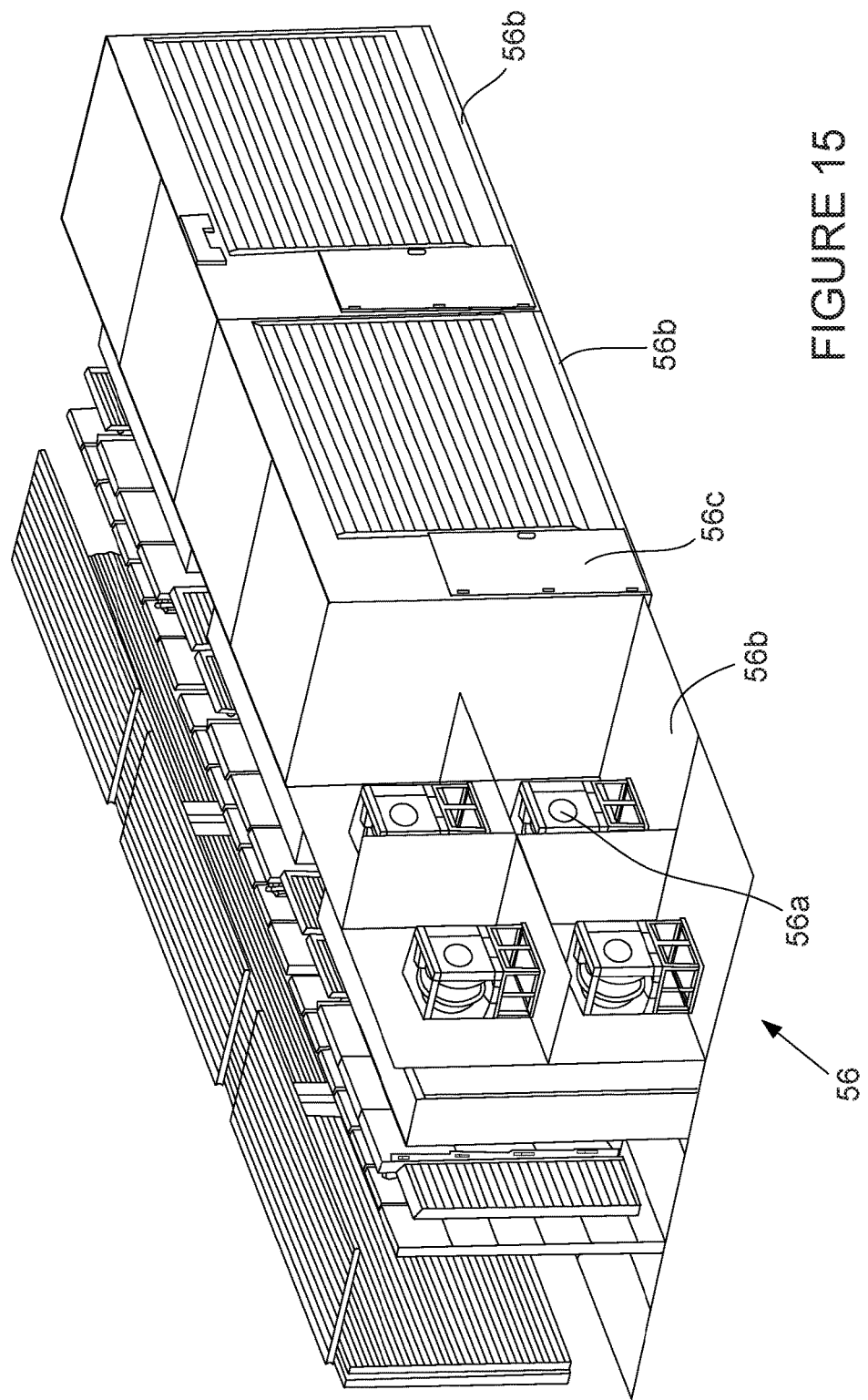
FIG. 15 is another high level perspective view of the modular cooling unit but with its outer wall structure removed, and further with the wall structure surrounding one of the fan units removed.

With reference to FIGS. 9-11, each modular cooling unit 50, in one embodiment, may form an evaporative (i.e., adiabatic) cooling unit that includes a filter unit 52, a media unit 54, a fan unit 56, and may draw on the order of 900 kW. FIGS. 12-14 further illustrate these components. Each fan unit 56 may include a plurality of fans 56a, and in one embodiment a total of twelve such fans 56a configured in three separate cabinets 56b as shown in FIG. 15. FIG. 15 further illustrates that the cabinets 56b each may have an isolated access through a door 56c.

Figure 16:
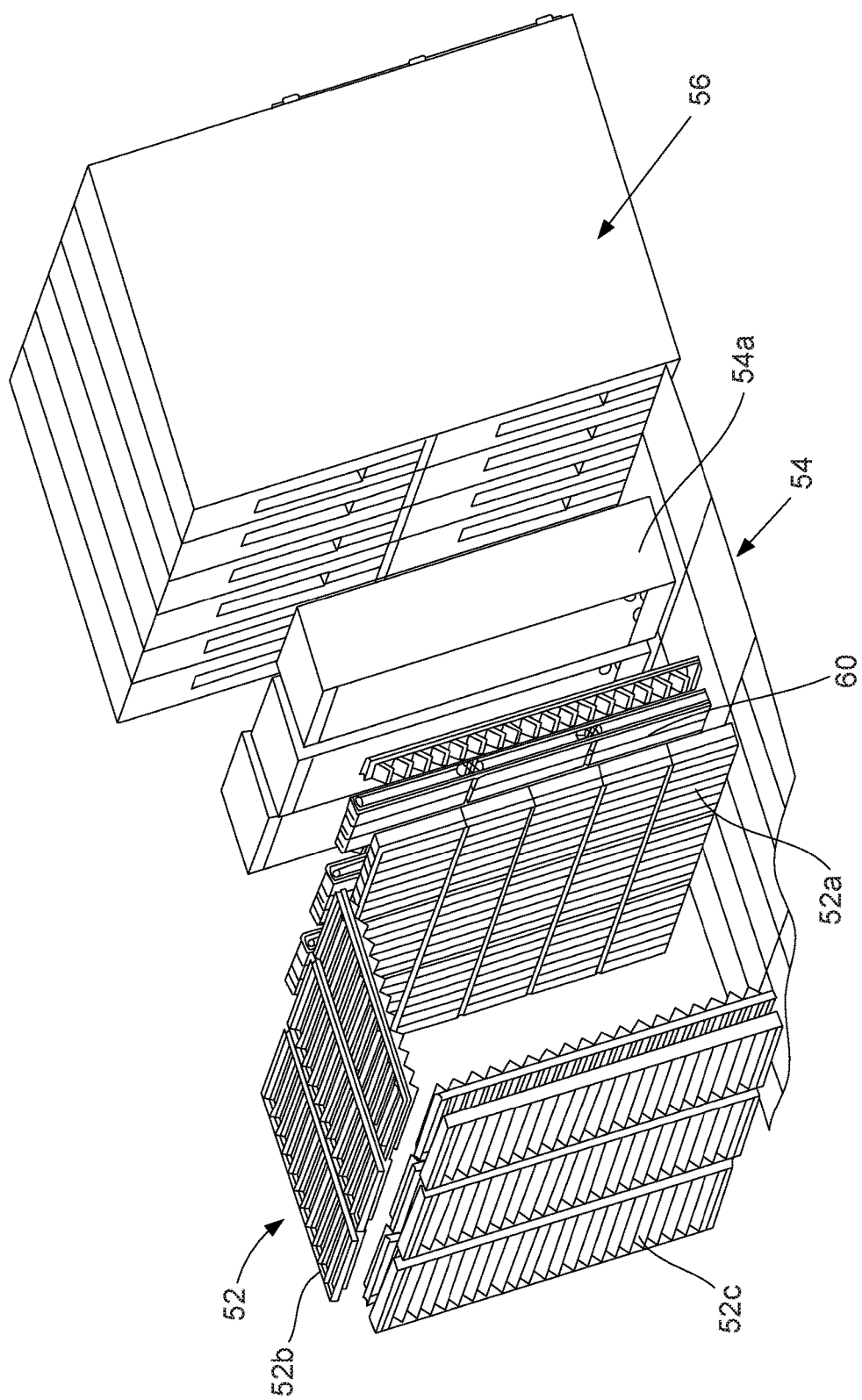
FIG. 16 further illustrates components that may be included within each of the modular cooling units.
Figure 17:
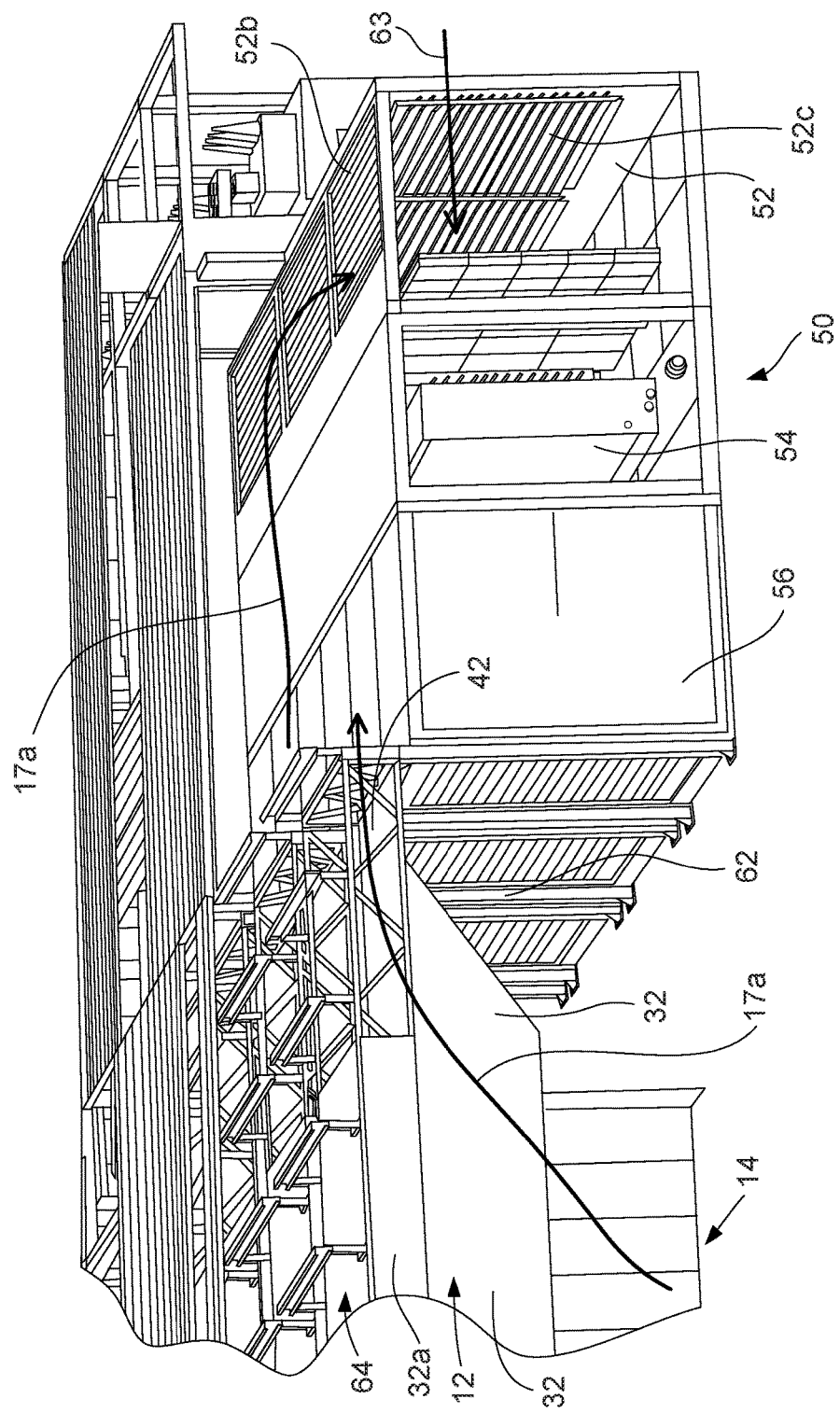
FIG. 17 is a perspective view of one modular cooling unit located adjacent to a plurality of the data center unit structures illustrating how hot exhaust (i.e., return) air from one of the hot isles may be returned to the modular cooling unit.

FIG. 16 illustrates that the media unit 54 may include three independent evaporative cooling modules 54a-54c having four cooling stages each. A DX coil and dampers 60 may optionally be included. The filter unit 52 may include a plurality of filters 52a, an electronically actuated return air damper 52b for controlling a return air flow into the modular cooling unit 50, and an electronically actuated outside air louver and damper 52c for controlling the flow of outside (ambient air) drawn into the cooling unit 50. FIG. 17 illustrates how hot air 17a in the hot air isles 17 may be returned within an area 64 formed between the ceiling panels 26/26a(the panels 26/26abeing visible only in FIG. 1), the bridging ceiling panels 26a, and the roof panels 42 of the unit structures 12 as "return" air through the return air dampers 52b to the modular cooling unit 50. Cool air 62 is supplied into each of the cold aisles 15 by the modular cooling units 50, which are able to draw in outside air 63.

Figure 18:
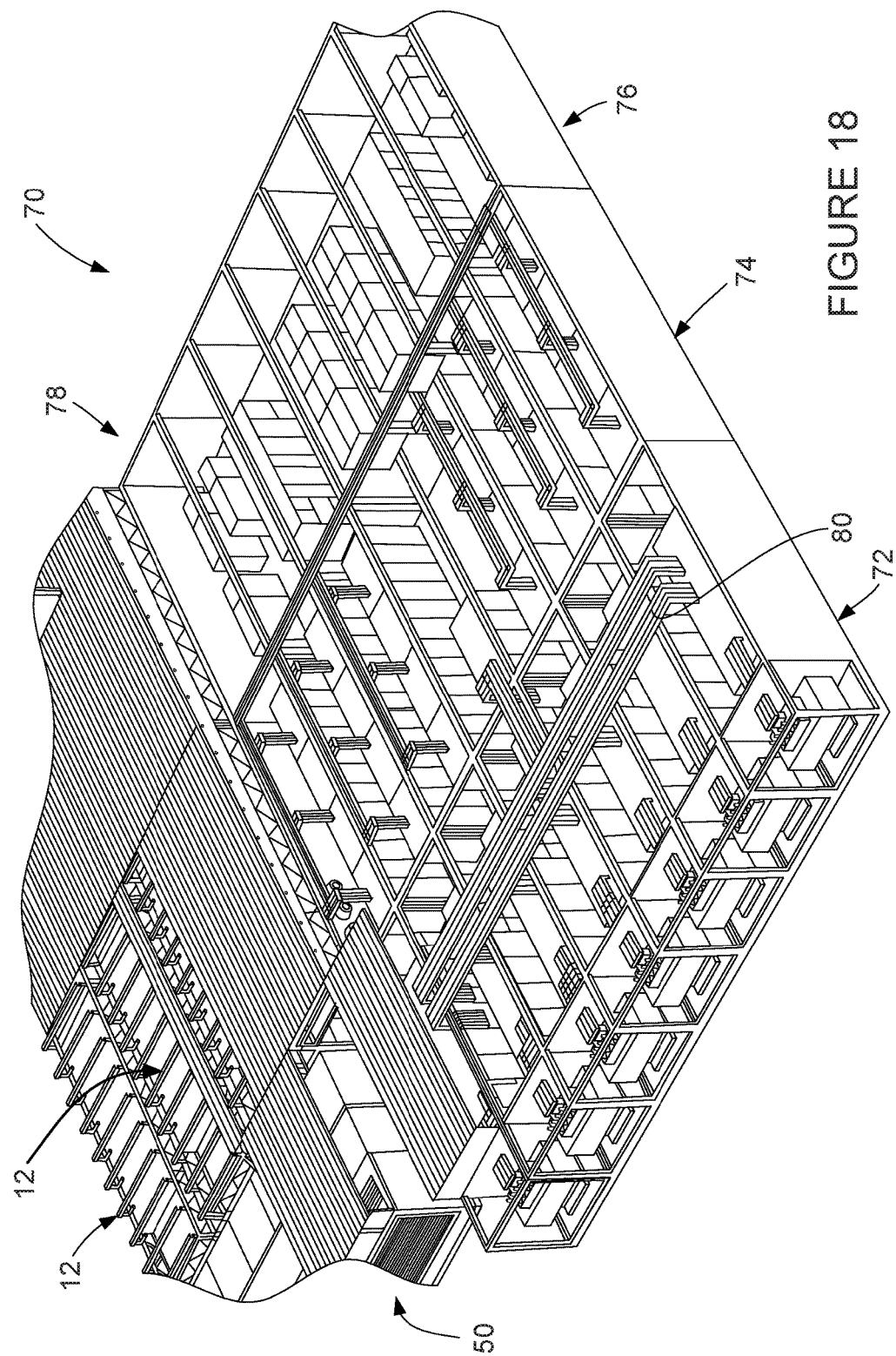
FIG. 18 is a high level overhead view of a portion of a data center illustrating a plurality of modular sections that together form a "power hall" for a data center, and which are located adjacent to a plurality of the data center unit structures.
Figure 19:
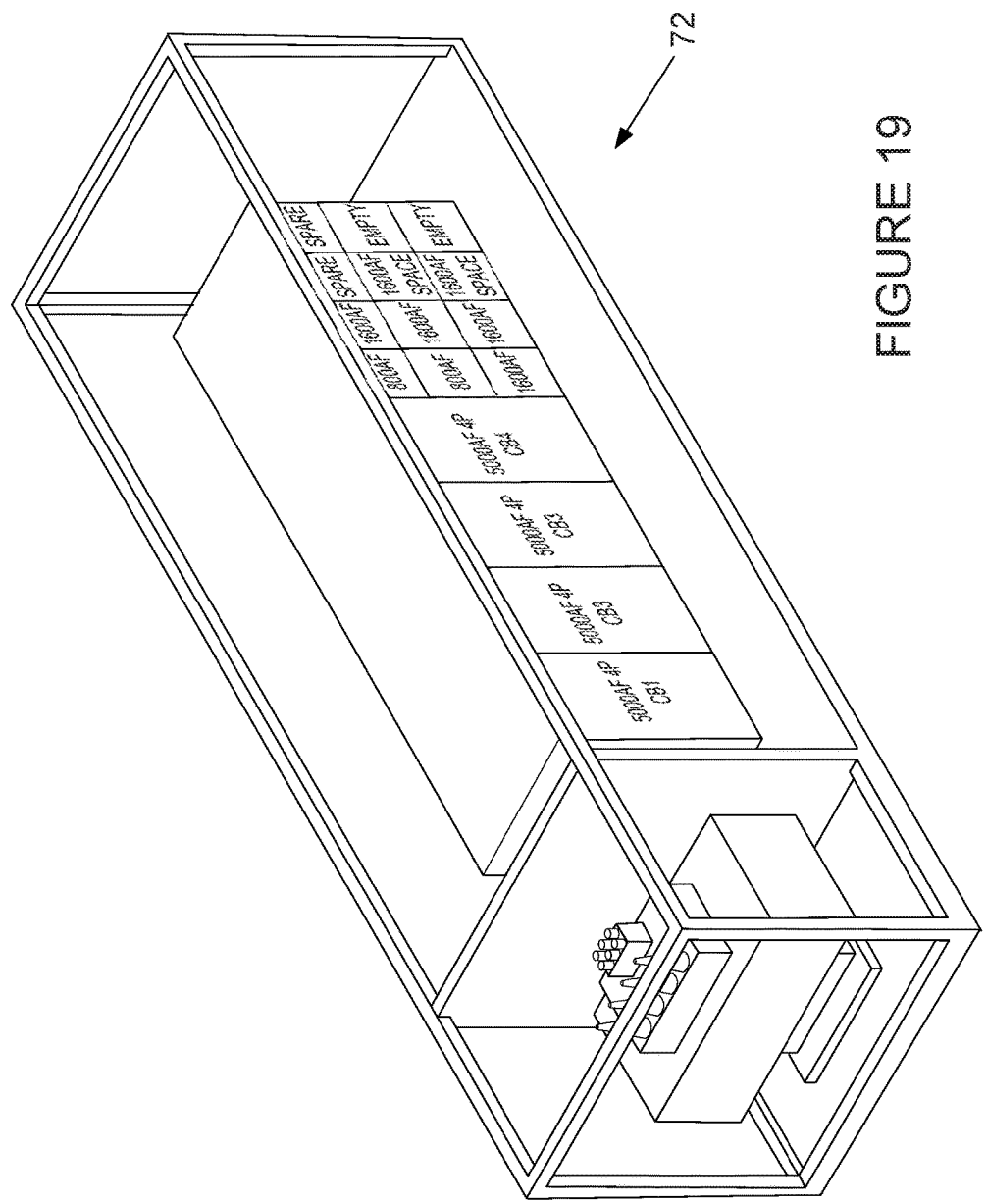
FIG. 19 illustrates a modular power supply unit for constructing the power hall shown in FIG. 18.
Figure 20:
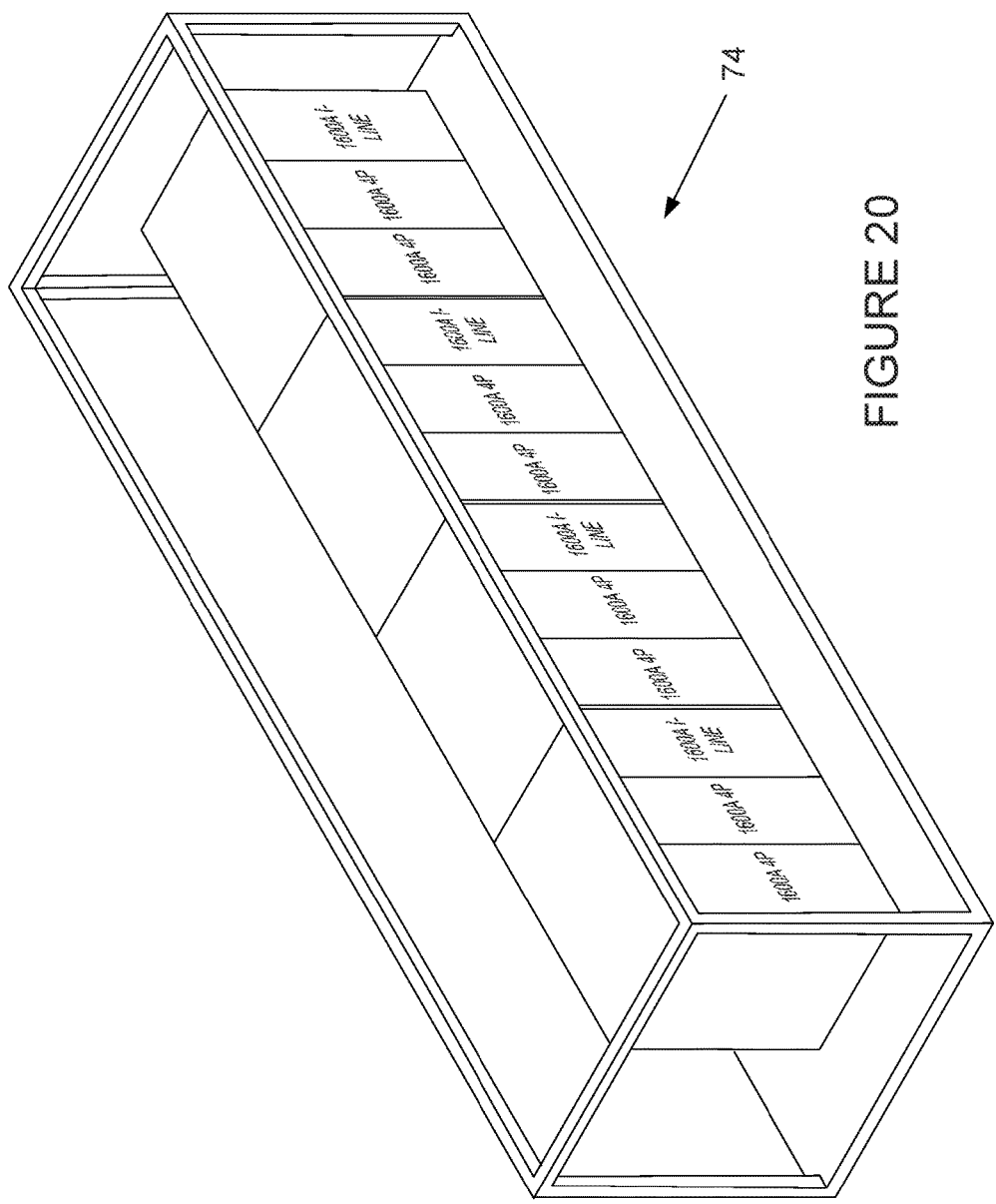
FIG. 20 illustrates a modular power cabinet unit for use in constructing the power hall shown in FIG. 18.

FIG. 18 illustrates one embodiment of a modular "power hall" 70 that may be used in connection with the unit structures 12 to form the modular data center facility 10. With additional reference to FIGS. 19-22, the modular power hall 70 may be made up of one or more modular power supply units 72 (FIG. 19), one or more modular power cabinet units 74 (FIG. 20), one or more modular UPS (uninterruptible power supply) units 76 and one or more modular PDU (power distribution unit) units 78, as well as any other type of power component or subsystem. FIG. 18 also shows a plurality of electrical bus bars 80 that may be used to connect the various components in each of the modular units 72-78 as needed to distribute power.

The modular power supply units 72 may each include a main bus, for example a 5000 A main bus for supplying 100 kA at 480V. A plurality of main breakers and distributed breakers may also be included along with a suitable power control system and a power quality meter.

The modular power cabinet units 74 may each include a 1600 A bus main bus for delivering 65 kA at 480V. Power breakers and distribution breakers may be configured as needed for specific applications.

The modular UPS units 76 may each include parallel 400 kVA/400 kW modules to provide 750 kW of backup power. However, it will be appreciated that the UPS units 76 may be configured as needed to suit a specific application.

Each of the modular PDU units 78 may be configured to provide 300 kVA 480/208/120V, or a different selected electrical output. Load distribution breakers may also be mounted in cabinets (not shown) that are in turn mounted to the sides of a frame of each PDU contained in the modular PDU unit 78.

Each of the modular units 72-78 may have similar or identical dimensions. In one embodiment the dimensions of the modular units 72-78 are identical with a length of 12192 mm (40 feet), a width of 3658 mm (12 feet) and a height of 3500 mm (11 feet and 5.8 inches). Obviously these dimensions may be varied slightly if needed. In this example, the modular units 72-78 may have length and width dimensions that are the same as the unit structures 12. These dimensions enable shipping of the modular units 72-78 in conventional shipping containers.

Figure 21:
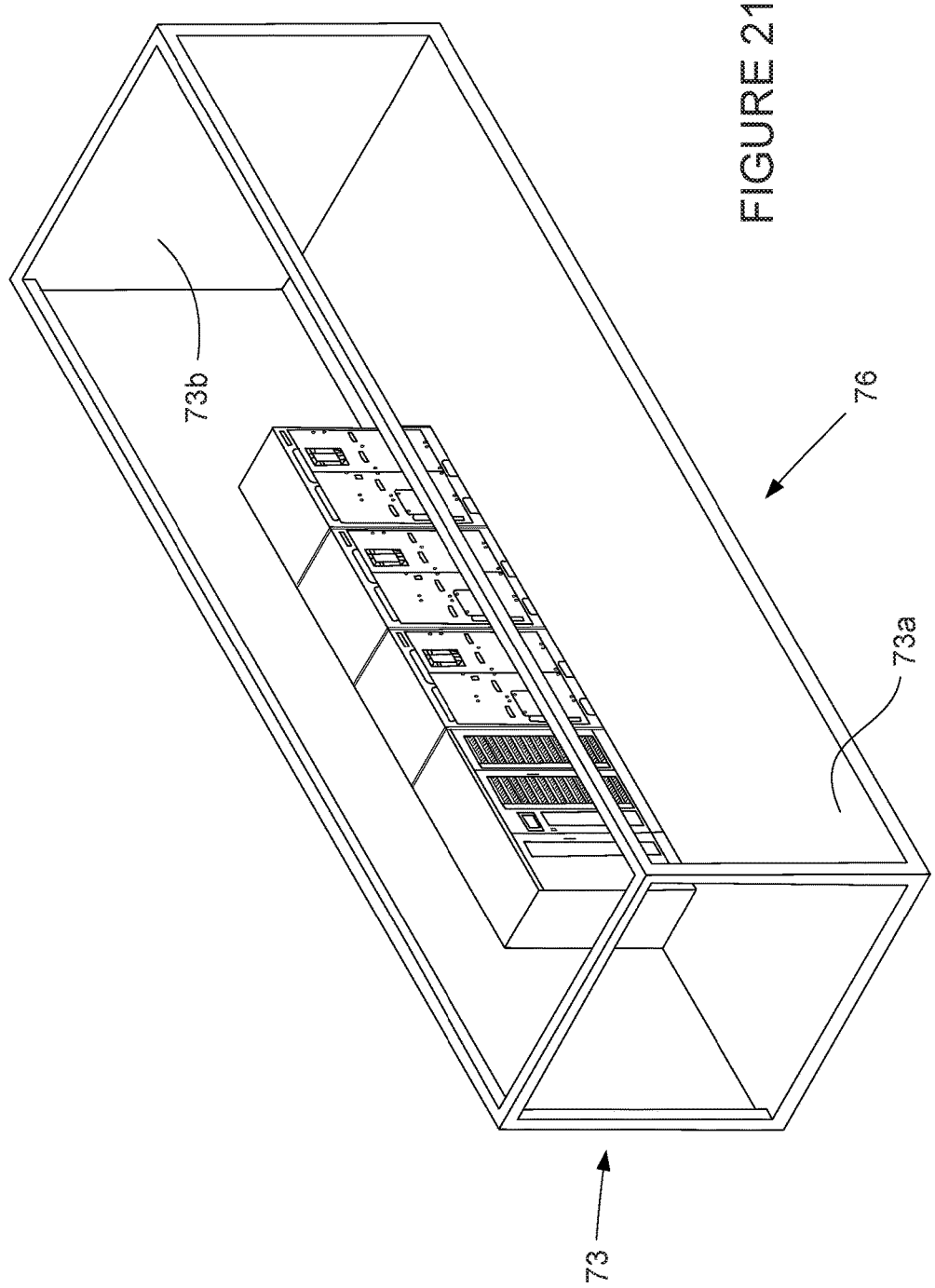
FIG. 21 shows a modular UPS unit for use in constructing the power hall shown in FIG. 18.
Figure 22:
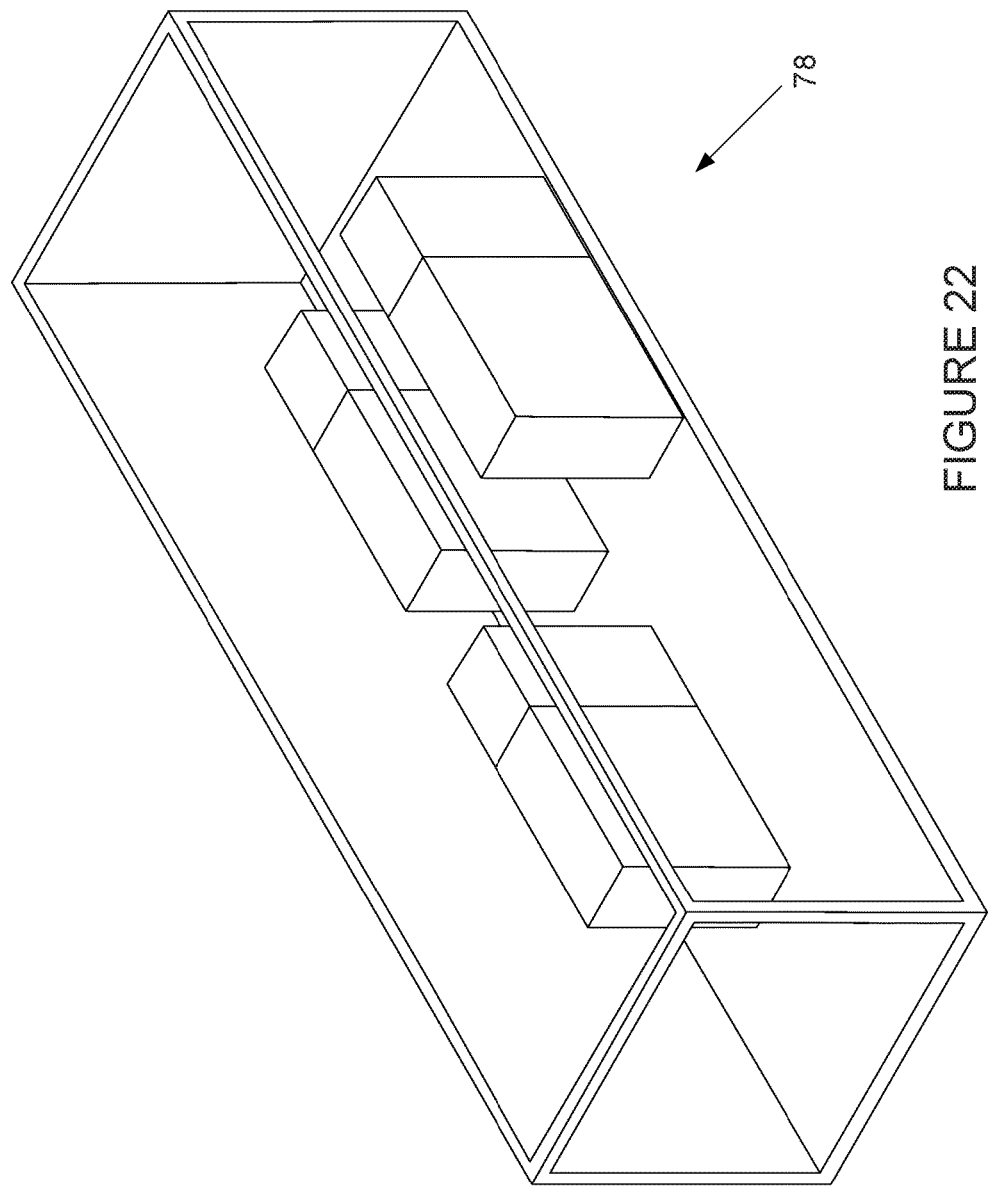
FIG. 22 shows a modular PDU unit for use in constructing the power hall shown in FIG. 18.

With brief reference to FIG. 21, each of the modular units 72-78 may include a frame structure 73 having one or more of components secured thereto such as a floor 73a and one or more wall portions 73b. The modular units 72-78 are also rapidly deployable when they are received at the destination site. The modular configuration of the units 72-78 allows for easily expanding the power supply capabilities of the power hall 70 as data center needs grow.

Figure 23:
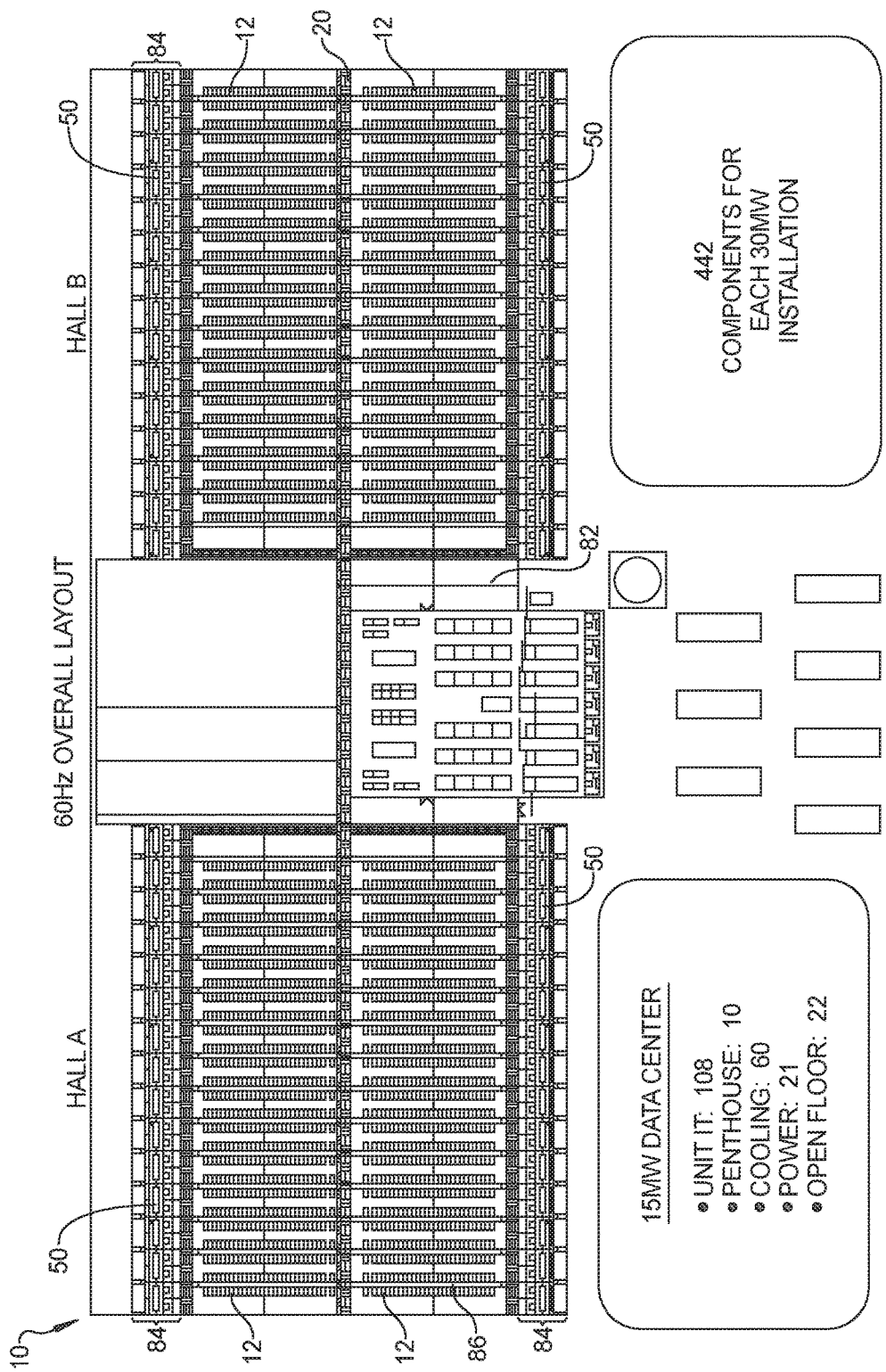
FIG. 23 is an overhead view of one exemplary layout for a data center that makes use of two halls separated by a modular office/storage area and a modular water treatment unit.

FIG. 23 shows an overhead view of one example of an implementation of the modular data center facility 10. The unit structures 12 are grouped into two halls, "Hall A" and "Hall B", separated by a modular office/storage section area 80. A modular water treatment section 82 may include water treatment equipment. Rows 84 of modular cooling units 50 may be arranged adjacent the rows of unit structures 12. A row of modular penthouse exhaust structures 20 (not shown in FIG. 23) may extend over a hallway area 86, perpendicularly to the unit structures 12, to interface with the hot aisles 17 adjacent the unit structures 12. A modular room 86 may be included for other data center or office equipment.

Figure 24:
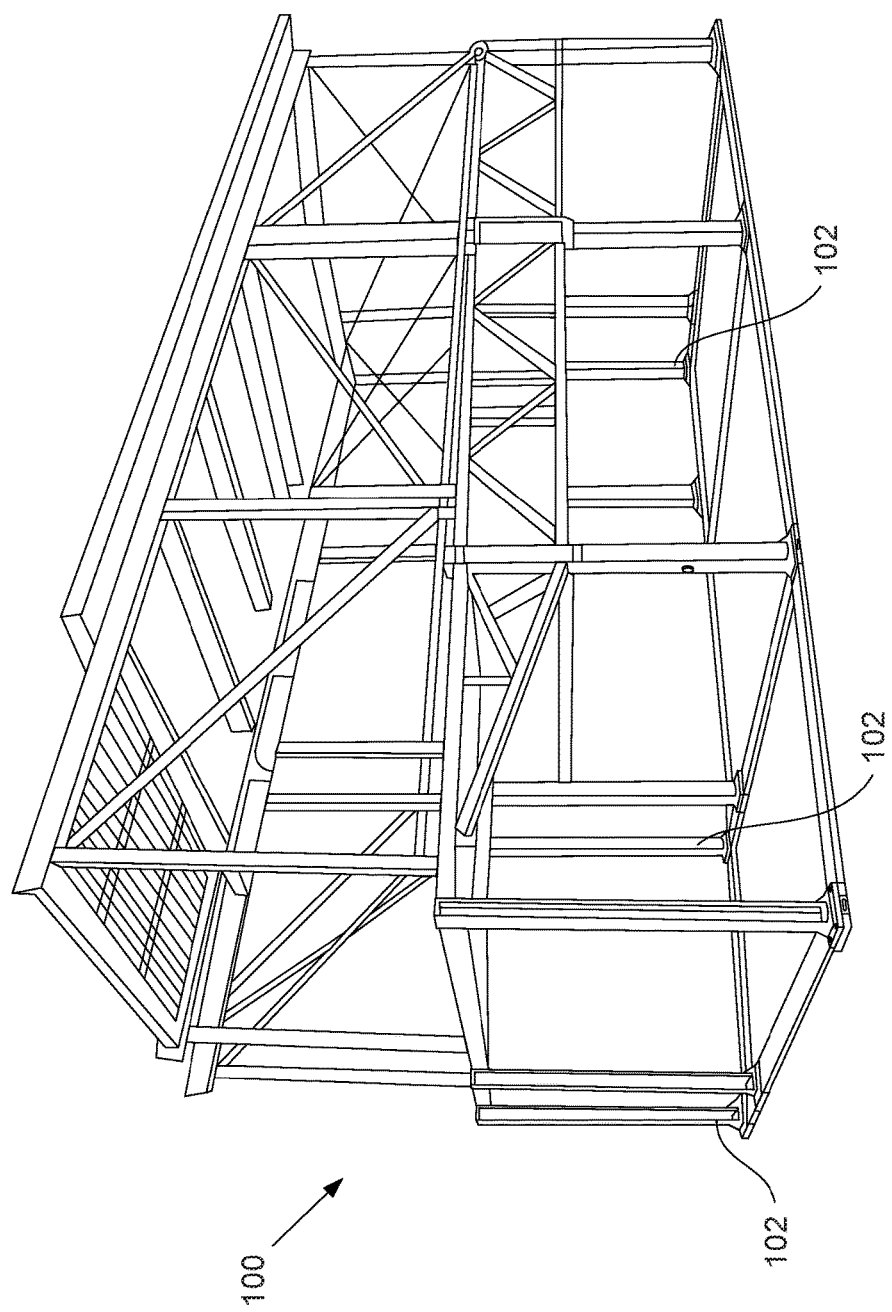
FIG. 24 is a perspective view of another embodiment of the unit structure.

Referring to FIG. 24, a unit structure 100 is shown in accordance with another embodiment of the present disclosure. The unit structure 100 is this example also has additional structural columns 102 that may be used to help form a hot aisle with one or more doors at opposing ends of the unit structure 100.

Figure 25:
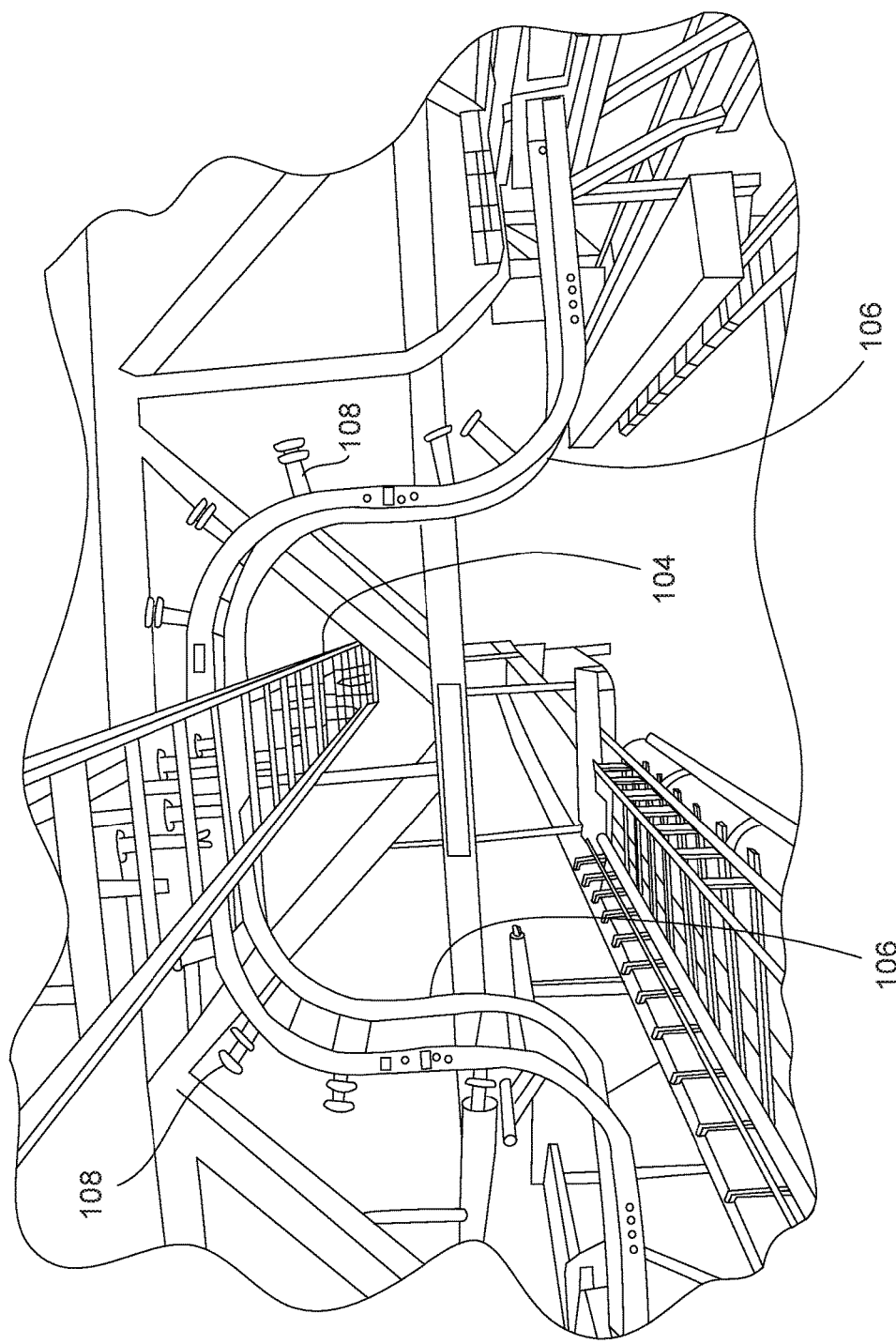
FIG. 25 is a perspective view of a portion of the unit structure of FIG. 24 illustrating a centrally located cable tray.

The unit structure 100 can also be seen in FIG. 25 to include a central, elongated tray 104 that runs a substantial portion of a full length of the unit structure 100. The central, elongated tray 104 may include a pair of curving tray portions 106 that enable cables to be fed out from the central, elongated tray 104. The central, elongated tray 104 and the curving tray portions 106 may each include a plurality of posts 108 to help retain cables within the trays 104 and 106.

It will be appreciated that the various embodiments of the present disclosure may incorporate built in lighting fixtures, as well as one or more lengths of built in conduit for the delivery of water or a different fire suppression agent. The cable trays 38, 40 and 104 may be used to divide and route specific types of cabling (i.e., optical, power, network, etc.) depending on user requirements or preferences.

The various embodiments of the modular data center facility 10 enable the various modular components that are used to form the data center to be easily shipped to a destination site and constructed in a desired configuration. The modular components the data center facility 10 can be rapidly deployed so that a fully functioning data center can be constructed much more quickly than a conventional "stick built" data center structure.

While various embodiments have been described, those skilled in the art will recognize modifications or variations which might be made without departing from the present disclosure. Any dimensions given on the drawings hereof are intended to be merely examples of suitable dimensions, and such may be modified as needed to meet the needs of specific applications. The examples illustrate the various embodiments and are not intended to limit the present disclosure. Therefore, the description and claims should be interpreted liberally with only such limitation as is necessary in view of the pertinent prior art.

What is claimed is:

1. A modular data center comprising:
    a plurality of unit structures arranged generally parallel to one another;
    a plurality of supports for supporting the unit structures elevationally above a floor, and wherein adjacent ones of the unit structures form hot aisles therebetween through which hot air generated from data center components is channeled;
    each said unit structure forming an elongated structure having:
        a frame structure;
        a roof panel supported by the frame structure; and
        a ceiling panel spaced apart from the roof panel for defining a volume through which the hot air from one of the hot aisles is received and channeled;
        the roof panel helping to form a cold aisle between adjacent rows of data center components disposed below the unit structure, the cold aisle being configured for channeling cold air between the data center components; and
    further comprising at least one penthouse exhaust structure configured to be supported above the hot aisles and arranged perpendicularly, relative to the unit structures, to span across at least a subplurality of adjacent ones of the unit structures, the penthouse exhaust structure including at least one fan for exhausting the hot air only from the hot aisles associated with adjacent pairs of the subplurality of unit structures to an ambient environment.

2. The modular data center of claim 1, wherein the unit structures each include a plurality of foldable panels configured to be suspended below the unit structures to help contain cold air within the cold aisle.

3. The modular data center of claim 2, wherein the foldable panels of each said unit structure are foldable into a space efficient configuration disposed closely adjacent the roof panel to facilitate shipping and packaging.

4. The modular data center of claim 1, wherein each said penthouse exhaust structure includes a plurality of exhaust fans arranged in opposing fashion.

5. The modular data center of claim 1, further comprising a plurality of the penthouse exhaust structures arranged to extend generally perpendicular to the unit structures.

6. The modular data center of claim 1, further comprising a plurality bridging ceiling panels disposed between adjacent ceiling panels of adjacently positioned ones of the unit structures, to assist in forming the hot aisles.

7. The modular data center of claim 1, wherein the unit structures each comprise at least one cable tray supported from the frame structure so as to be suspended from the unit structure.

8. The modular data center of claim 7, wherein the cable tray is supported by a hanger, the hanger in turn being coupled to the frame structure.

9. The modular data center of claim 8, wherein the hanger is pivotally supported from the frame structure such that the hanger and cable tray are pivotable between a deployed position and a stowed positioned.

10. The modular data center of claim 1, further comprising a modular cooling unit adapted to be positioned adjacent to the unit structures so as to provide a cooling airflow into the cold aisle of at least one of the unit structures.

11. The modular data center of claim 1, further comprising a plurality of modular cooling units adapted to be disposed generally perpendicular to common ends of the cold aisles of the unit structures, to generate a plurality of cooling airflows that are directed into the cold aisles of the unit structures.

12. The modular data center of claim 1, further comprising at least one of:
    a modular power supply unit;
    a modular power cabinet unit;
    a modular uninterruptible power supply (UPS) unit; and
    a modular power distribution unit (PDU).

13. The modular data center of claim 1, further comprising:
    a modular power supply unit;
    a modular power cabinet unit;
    a modular uninterruptible power supply (UPS) unit; and
    a modular power distribution unit (PDU); and
    wherein the modular power supply unit, the modular power cabinet unit, the modular uninterruptible power supply (UPS) unit and the modular power distribution unit (PDU) each have approximately a common length, width and height.

14. The modular data center of claim 13, wherein the length and the width are the same as a length and width of the unit structure.

15. The modular data center of claim 1, wherein the unit structures are configured to form two halls for the modular data center, and further comprising a modular office storage section separating the two halls.

16. A method for forming a modular data center comprising:
    providing a plurality of unit structures each having a frame, each said unit structure operating to help form a cold aisle through which cold air is circulated, and a hot aisle through which hot air is circulated;
    supporting the unit structures above a floor to allow data center components to be positioned under each of the unit structures in two rows facing each other to help form the cold aisle;
    using one said row of each of the two rows of data center components from adjacent ones of the unit structures to help form the hot aisle therebetween;
    further configuring each of the unit structures to form a volume, defined at least in in part by a ceiling panel and at least in part by a roof panel, through which the hot air from one of the hot aisles may be received and channeled;
    further using the roof panel to help form the cold aisle between adjacent rows of data center components disposed below the unit structure, the cold aisle being configured for channeling cold air between the data center components;
    further using a penthouse exhaust structure supported above unit structures, and arranged perpendicularly to the unit structures, to span a plurality of adjacent hot aisles and to receive the hot air from the plurality of adjacent hot aisles; and
    further using a fan in the penthouse exhaust structure to help draw only the hot air from the plurality of adjacent hot aisles upwardly into the penthouse exhaust structure and to exhaust the hot air received within the penthouse exhaust structure to an ambient environment.

17. The method of claim 16, further comprising using a plurality of foldable panels operably associated with each of the unit structures to help form the cold aisle associated with each said unit structure.

18. The method of claim 16, further comprising using at least one of:
    a modular cooling unit to generate cold air to be circulated into the cold aisle;
    a modular power supply unit;
    a modular power cabinet unit to supply power to the data center components disposed adjacent the cold aisles;
    a modular uninterruptible power supply (UPS) unit to supply power to the data center components; and
    a modular power distribution unit (PDU) for distributing power to the data center components.

* * * * *